(12) United States Patent
Funaki et al.

(10) Patent No.: US 7,105,268 B2
(45) Date of Patent: Sep. 12, 2006

(54) POLYMER FOR PHOTORESIST AND RESIN COMPOSITIONS THEREFOR

(75) Inventors: Yoshinori Funaki, Himeji (JP); Kiyoharu Tsutsumi, Himeji (JP); Keizo Inoue, Himeji (JP); Tomoko Adachi, Himeji (JP)

(73) Assignee: Daicel Chemical Industries, Ltd., Osaka (JP)

( * ) Notice: Subject to any disclaimer, the term of this patent is extended or adjusted under 35 U.S.C. 154(b) by 218 days.

(21) Appl. No.: 10/239,051

(22) PCT Filed: Dec. 11, 2001

(86) PCT No.: PCT/JP01/10832

§ 371 (c)(1),
(2), (4) Date: Sep. 19, 2002

(87) PCT Pub. No.: WO02/48217

PCT Pub. Date: Jun. 20, 2002

(65) Prior Publication Data

US 2003/0148210 A1 Aug. 7, 2003

(30) Foreign Application Priority Data

Dec. 13, 2000 (JP) .............................. 2000-378750

(51) Int. Cl.
G03F 7/039 (2006.01)
G03F 7/26 (2006.01)
C08F 20/28 (2006.01)
C07D 311/94 (2006.01)
C07D 313/20 (2006.01)

(52) U.S. Cl. .................. 430/270.1; 549/266; 549/267; 549/270; 526/270; 526/266; 526/271; 430/326; 430/908; 430/311; 430/323

(58) Field of Classification Search ................ 549/266, 549/267, 270; 526/270, 266, 271; 430/270.1, 430/326
See application file for complete search history.

(56) References Cited

U.S. PATENT DOCUMENTS

| | | | | |
|---|---|---|---|---|
| 6,303,266 B1 * | 10/2001 | Okino et al. | ............. | 430/270.1 |
| 6,746,818 B1 * | 6/2004 | Kinsho et al. | ............ | 430/270.1 |
| 2001/0026901 A1 * | 10/2001 | Maeda et al. | ............. | 430/270.1 |
| 2003/0008232 A1 * | 1/2003 | Kinsho et al. | ............ | 430/270.1 |
| 2004/0058269 A1 * | 3/2004 | Hada et al. | ............. | 430/270.1 |

FOREIGN PATENT DOCUMENTS

| | | | |
|---|---|---|---|
| JP | 10-207069 A | | 8/1998 |
| JP | 2000026446 A | * | 1/2000 |
| JP | 2000-122294 A | | 4/2000 |
| JP | 2000147769 A | * | 5/2000 |
| JP | 2000-159758 A | | 6/2000 |
| JP | 2001-242627 A | | 9/2001 |
| JP | 2002371114 A | * | 12/2002 |

OTHER PUBLICATIONS

Henbest, H.B. et al, J. Chem. Soc. pp. 221-226 (1959).*
Tenaglia A. et al, Tetrahedron Letter, vol. 32, No. 9, pp. 1169-1170, (1991).*
Kanou et al, Publication No. 2002-371114, Patent Abstracts of Japan and attached English Machine translation of JP 2002 371114 published in Dec. 26, 2002.*
Derwent-Acc-No.: 2003-370865, Derwent Information LTD, FAmily of 2001 JP -0179614 application filed Jun. 14, 2001.*
Publication No.: 2000-147769, Patent Abstracts of Japan, English abstract of JP 2000-147769 published May 2000 and English Machine Translation thereof.*
Publication No.: 2000-026446, Patent Abstracts of Japan, English abstract of JP 2000-26446 published Jan. 2000 and English Machine Translation thereof.*
Publication No.: 2001-242627, Patent Abstracts of Japan, English abstract of JP 2000-24627 published Feb. 28, 2000 and English Machine Translation thereof.*
Publication No.: 2000-122294, Patent Abstracts of Japan, English abstract of JP 2000-122294 published Mar. 28, 2000 and English Machine Translation thereof.*

(Continued)

Primary Examiner—Cynthia Hamilton
(74) Attorney, Agent, or Firm—Birch, Stewart, Kolasch & Birch, LLP

(57) ABSTRACT

A polymeric compound for photoresist of the invention includes at least one monomer unit represented by following Formula (I):

$$\text{—}(CH_2\text{—}C(R^1))\text{—}C(=O)\text{—}O\text{—}[(HO)_n]\text{—}[\phantom{x}]_m\text{—}C(R^2)(R^3)\text{—}O\text{—}C(=O)\text{—}C(R^4)(R^5)\text{—}]_p\text{—}]_q \quad (I)$$

wherein $R^1$, $R^2$, $R^3$, $R^4$ and $R^5$ are the same or different and are each a hydrogen atom or a methyl group; m, p and q each denote an integer of from 0 to 2; and n denotes 0 or 1, where the hydroxyl group and carbonyloxy group extending from a principle chain in the formula are independently combined with either of two carbon atoms on the far-left portion of the rings.

By using the polymeric compound for photoresist as a base of a photoresist, the resulting photoresist exhibits well-rounded adhesion to substrates and resistance to etching.

15 Claims, No Drawings

OTHER PUBLICATIONS

Partial English language translation of specification and claims 1-14 of Japanese Unexamined Patent Application Publication No. 2001-242627A (Sep. 7, 2001).

Partial English language translation of specification and claims 1-10 of Japanese Unexamined Patent Application Publication No. 2000-122294A (Apr. 28, 2000).

Partial English language translation of specification and claims 1-5 of Japanese Unexamined Patent Application Publication No. 10-207069A (Aug. 7, 1998).

Partial English language translation of specification and claims 1-7 of Japanese Unexamined Patent Application Publication No. 2000-159758A (Jun. 13, 2000).

* cited by examiner

POLYMER FOR PHOTORESIST AND RESIN COMPOSITIONS THEREFOR

This application is the national phase under 35 U.S.C. § 371 of PCT International Application No. PCT/JP01/10832 which has an International filing date of Dec. 11, 2001, which designated the United States of America.

TECHNICAL FIELD

The present invention relates to a polymeric compound for photoresist for use in micromachining of semiconductors, to a resist composition for photoresist containing the polymeric compound, and to a process of fabricating a semiconductor. The invention also relates to a (meth) acrylic ester derivative having a lactone skeleton which is useful as a raw material for the polymeric compound for photoresist, to a cyclic alcohol having a lactone skeleton which is useful in production of the (meth)acrylic ester derivative, and to processes for producing these compounds.

BACKGROUND ART

Resins for photoresist for use in fabricating processes of semiconductors must have the following functions. Specifically, they must adhere to substrates, be eliminated by action of an acid generated from a photosensitive acid generator with exposure and become soluble in basic developing solutions, and be resistant to dry etching. Increasing expectations are specifically placed on resins for photoresist for use in fabrication of semiconductors on the order of giga using ArF excimer laser as a light source in exposure process step. However, the ArF excimer laser has a wavelength in the far-ultraviolet region of 193 nm, and resists used must be transparent in the far-ultraviolet region. Some novel resins differing from novolak resins now used have been proposed.

Among them, polycyclic alicyclic monomers each containing a lactone skeleton will exhibit adhesion to substrates when they are polymerized, may have resistance to etching and have received attention in recent times. However, only few proposals have been made on such monomers, for example, in Japanese Unexamined Patent Application Publications No. 2000-26446 and No. 2000-159758. Accordingly, demands are made on development of novel monomers and polymers for photoresist which can exhibit more excellent functions in order to design the best resists.

DISCLOSURE OF INVENTION

Accordingly, it is an object of the present invention to provide a novel polymer for photoresist which has well-rounded adhesion to substrates and resistance to etching, a resin composition for photoresist containing the polymer for photoresist as a base, and a process for fabricating a semiconductor using the resin composition for photoresist.

Another object of the present invention is to provide a novel polymer for photoresist which has well-rounded adhesion to substrates and resistance to etching and exhibits high affinity for developing solutions and rinsing solutions after exposure, a resin composition for photoresist containing the polymer for photoresist as a base, and a process for fabricating a semiconductor using the resin composition for photoresist.

A further object of the present invention is to provide a novel (meth)acrylic ester derivative having a lactone skeleton which is useful as a raw material for the polymeric compound for photoresist, a cyclic alcohol having a lactone skeleton which is useful in production of the (meth)acrylic ester derivative, and processes for producing these compounds.

After intensive investigations to achieve the above objects, the present inventors have attained success in developing a novel acrylate monomer having a polycyclic alicyclic skeleton including a lactone ring and have found that the monomer can yield a novel polymer for photoresist which has well-rounded adhesion to substrates and resistance to etching. The present invention has been accomplished based on these findings.

Specifically, the present invention provides a polymeric compound for photoresist, including at least one monomer unit represented by following Formula (I):

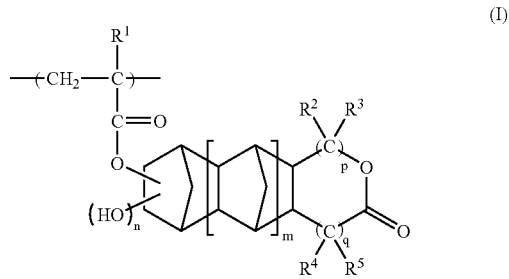

wherein $R^1$, $R^2$, $R^3$, $R^4$ and $R^5$ are the same or different and are each a hydrogen atom or a methyl group; m, p and q each denote an integer of from 0 to 2; and n denotes 0 or 1, where the hydroxyl group and carbonyloxy group extending from a principle chain in the formula are independently combined with either of two carbon atoms on the far-left portion of the rings.

The polymeric compound for photoresist may include at least one monomer unit represented by Formula (I) and at least one selected from monomer units represented by following Formulae (IIa) through (IIg):

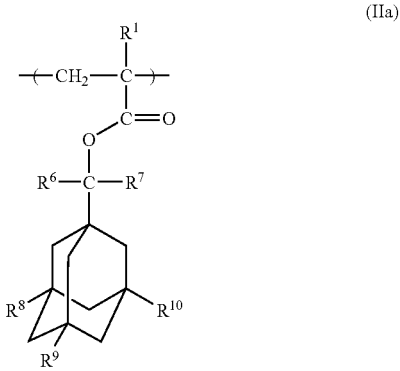

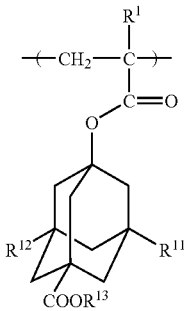 (IIb)

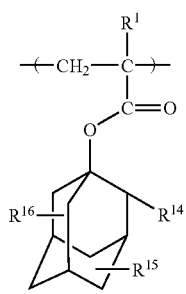 (IIc)

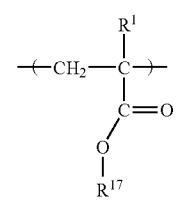 (IId)

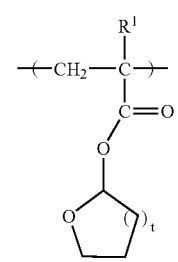 (IIe)

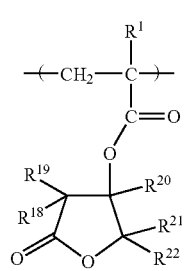 (IIf)

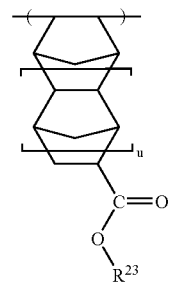 (IIg)

wherein $R^1$ is a hydrogen atom or a methyl group; $R^6$ and $R^7$ are the same or different and are each a hydrocarbon group containing from 1 to 8 carbon atoms; $R^8$, $R^9$ and $R^{10}$ are the same or different and are each a hydrogen atom, a hydroxyl group, or a methyl group; $R^{11}$ and $R^{12}$ are the same or different and are each a hydrogen atom, a hydroxyl group or a —COOR$^{13}$ group, where $R^{13}$ is a t-butyl group, a 2-tetrahydrofuranyl group, a 2-tetrahydropyranyl group or an 2-oxepanyl group; $R^{14}$ is a methyl group or an ethyl group; $R^{15}$ and $R^{16}$ are the same or different and are each a hydrogen atom, a hydroxyl group or an oxo group; $R^{17}$ is a hydrocarbon group having a tertiary carbon atom at the bonding site with the oxygen atom indicated in the formula; $R^{18}$, $R^{19}$, $R^{20}$, $R^{21}$ and $R^{22}$ are the same or different and are each a hydrogen atom or a methyl group; $R^{23}$ is a t-butyl group, a 2-tetrahydrofuranyl group, a 2-tetrahydropyranyl group or an 2-oxepanyl group; t denotes an integer of from 1 to 3; and u denotes 0 or 1.

The polymeric compound for photoresist may further include at least one selected from monomer units represented by following Formulae (IIIa) through (IIIh):

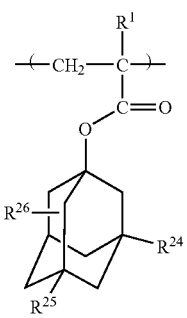 (IIIa)

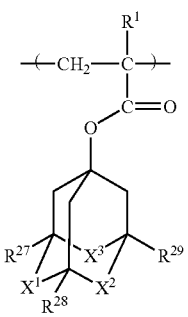 (IIIb)

-continued

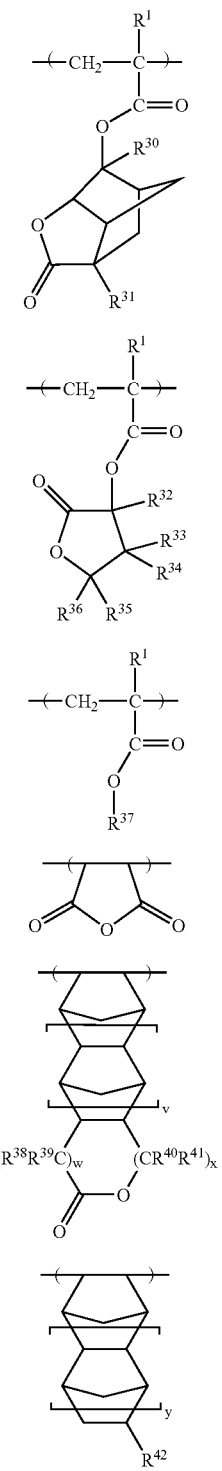

wherein $R^1$ is a hydrogen atom or a methyl group; $R^{24}$ and $R^{25}$ are the same or different and are each a hydrogen atom, a hydroxyl group or a carboxyl group; $R^{26}$ is a hydroxyl group, an oxo group or a carboxyl group; $X^1$, $X^2$ and $X^3$ are the same or different and are each —$CH_2$— or —CO—O—; $R^{27}$, $R^{28}$ and $R^{29}$ are the same or different and are each a hydrogen atom or a methyl group; $R^{30}$ and $R^{31}$ are the same or different and are each a hydrogen atom or a methyl group; $R^{32}$, $R^{33}$, $R^{34}$, $R^{35}$ and $R^{36}$ are the same or different and are each a hydrogen atom or a methyl group; $R^{37}$ is a hydrogen atom or a straight-chain, branched-chain, cyclic or bridged cyclic hydrocarbon group containing 1 to 20 carbon atoms which may have a substituent; $R^{38}$, $R^{39}$, $R^{40}$ and $R^{41}$ are the same or different and are each a hydrogen atom or a methyl group; $R^{42}$ is a hydrogen atom, a hydroxyl group, a hydroxymethyl group or a carboxyl group; and v, w, x and y are each 0 or 1, in addition to the at least one monomer unit represented by Formula (I) or in addition to the at least one monomer unit represented by Formula (I) and the at least one selected from monomer units represented by Formulae (IIa) through (IIg).

The polymeric compound for photoresist may have a solubility parameter of, for example, from 19.5 to 24.5 $(J/cm^3)^{1/2}$ as determined by Fedors method.

The present invention also provides a resin composition for photoresist, including at least the polymeric compound for photoresist and a photosensitive acid generator.

In addition, the present invention provides a process for fabricating a semiconductor. The process includes the steps of applying the resin composition for photoresist to a base or a substrate to form a resist film, exposing, developing and thereby patterning the resist film.

The present invention further provides a (meth)acrylic ester derivative represented by following Formula (1):

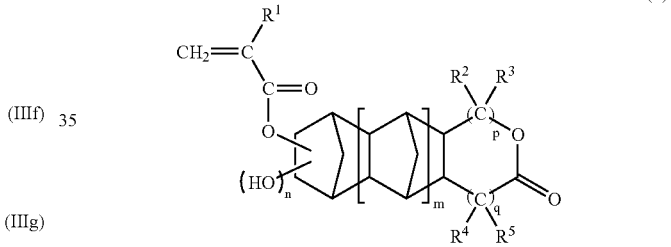

wherein $R^1$, $R^2$, $R^3$, $R^4$ and $R^5$ are the same or different and are each a hydrogen atom or a methyl group; m, p and q each denote an integer of from 0 to 2; and n denotes 0 or 1 where the (meth)acryloyloxy group and hydroxyl group in the formula are independently combined with either of two carbon atoms on the far-left portion of the rings.

In addition, the present invention provides a process for producing a (meth)acrylic ester derivative. The process includes the step of allowing a cyclic alcohol represented by following Formula (4):

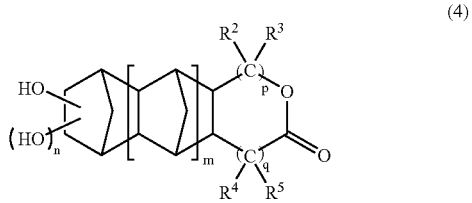

wherein $R^2$, $R^3$, $R^4$ and $R^5$ are the same or different and are each a hydrogen atom or a methyl group; m, p and q each denote an integer of from 0 to 2; n denotes 0 or 1, where the hydroxyl groups in the formula are independently combined with either of two carbon atoms on the far-left portion of the rings, to react with (meth)acrylic acid or a reactive derivative thereof to thereby yield a compound represented by following Formula (1):

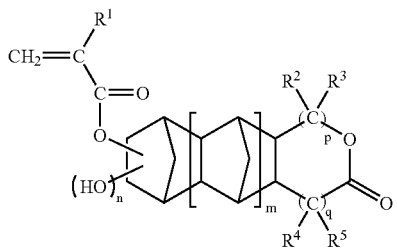

wherein $R^1$ is a hydrogen atom or a methyl group; and $R^2$, $R^3$, $R^4$, $R^5$, m, p, q, and n have the same meanings as defined above, where the (meth)acryloyloxy group and hydroxyl group in the formula are independently combined with either of two carbon atoms on the far-left portion of the rings.

The present invention further provides a process for producing a cyclic alcohol. The process includes the step of reducing an epoxy compound represented by following Formula (5):

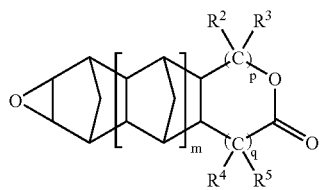

wherein $R^2$, $R^3$, $R^4$ and $R^5$ are the same or different and are each a hydrogen atom or a methyl group; and m, p and q each denote an integer of from 0 to 2, to thereby yield a cyclic alcohol represented by following Formula (4a):

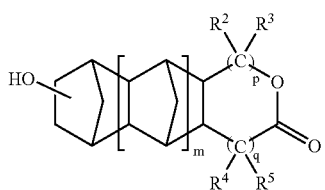

wherein $R^2$, $R^3$, $R^4$, $R^5$, m, p, and q have the same meanings as defined above, where the hydroxyl group in the formula is combined with either of two carbon atoms on the far-left portion of the rings.

In addition and advantageously, the present invention provides a cyclic alcohol represented by following Formula (4b):

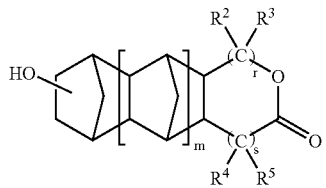

wherein $R^2$, $R^3$, $R^4$ and $R^5$ are the same or different and are each a hydrogen atom or a methyl group; m denotes an integer of from 0 to 2; r and s each denote 0 or 1, where r plus s equals 1, and where the hydroxyl group in the formula is combined with either of two carbon atoms on the far-left portion of the rings.

In the present description, the terms "acrylic" and "methacrylic" may generically be referred to as "(meth)acrylic", and the terms "acryloyl" and "methacryloyl" may generically be referred to as "(meth)acryloyl".

BEST MODE FOR CARRYING OUT THE INVENTION

The polymeric compound for photoresist of the present invention comprises at least one monomer unit (constitutional repeating unit) represented by Formula (I) (hereinafter may be referred to as "Monomer Unit 1") as a unit for constituting the polymer molecule. Monomer Unit 1 has a hydrophilic lactone ring, as well as a hydroxyl group when n is 1 and thereby plays a role as an adhesion-imparting unit for increasing adhesion to substrates. It also has an alicyclic carbon ring and thereby serves to increase resistance to etching. By using an appropriate polymerizable monomer that can exhibit the function of alkali-developing property (acid-decomposable property) as a comonomer upon production of the polymer, the resulting polymer can have all the functions required as a resist.

In Formula (I), $R^1$, $R^2$, $R^3$, $R^4$ and $R^5$ are the same or different and are each a hydrogen atom or a methyl group. The repetition numbers m, p and q are each an integer of from 0 to 2, and n denotes 0 or 1. The hydroxyl group and the carbonyloxy group extending from the principle chain in the formula are independently combined with either of two carbon atoms on the far-left portion of the rings. In other words, the hydroxyl group and the carbonyloxy group are combined with different carbon atoms, respectively. The repetition number m is preferably 0 or 1, and p plus q preferably equals 1 or 2. It is particularly preferred that (i) p is 1 and q is 0, (ii) p is 0 and q is 1, (iii) p is 2 and q is 0, or (iv) p is 1 and q is 1.

The polymeric compound according to a preferred embodiment of the present invention comprises at least one monomer unit (hereinafter may be referred to as "Monomer Unit 2") selected from the monomer units (constitutional repeating units) represented by Formulae (IIa) through (IIg) in addition to the at least one monomer unit represented by Formula (I).

In Formula (IIa), hydrocarbons each containing 1 to 8 carbon atoms in $R^6$ and $R^7$ include, for example, methyl, ethyl, propyl, isopropyl, butyl, isobutyl, s-butyl, pentyl, isopentyl, 1-methylbutyl, 1-ethylpropyl, hexyl, isohexyl, 1-methylpentyl, 1-ethylbutyl, heptyl, 1-methylhexyl, octyl, 1-methylheptyl, and other $C_1$–$C_8$ alkyl groups; cyclopropyl, cyclopentyl, cyclohexyl, cycloheptyl, cyclooctyl, and other $C_3$–$C_8$ cycloalkyl groups; and phenyl group. Among them, methyl, ethyl, isopropyl, and other $C_1$–$C_3$ alkyl groups are preferred.

In Formula (IId), the "hydrocarbon group having a tertiary carbon atom at the bonding site with the oxygen atom indicated in the formula" in $R^{17}$ includes, for example, t-butyl group and t-amyl group. These hydrocarbon groups may each have a substituent.

In the monomer unit represented by Formula (IIa), a moiety containing an adamantane skeleton leaves from the carboxylic acid moiety combined with a principle chain by action of an acid to thereby yield a free carboxyl group. In the monomer unit represented by Formula (IIb), a carboxyl group which is protected with a protecting group and is combined with an adamantane skeleton is deprotected with action of an acid to thereby yield a free carboxyl group. In the monomer unit represented by Formula (IIc), an adamantane skeleton leaves from a carboxylic acid moiety combined with a principle chain by action of an acid to thereby yield a free carboxyl group. Likewise, in the monomer units represented by Formulae (IId), (IIe), (IIf) and (IIg), a carboxylic ester moiety is decomposed and leaves by action of an acid to thereby yield a free carboxyl group. Monomer Units 2 thereby play a role as an alkali-soluble unit for enabling the resin to be dissolved upon development.

The monomer units represented by Formulae (IIa), (IIb), (IIc) and (IIg) each have an alicyclic carbon skeleton, are thereby highly-transparent and are very highly resistant to etching. Monomer units represented by Formula (IIa) where at least one of $R^8$, $R^9$ and $R^{10}$ is a hydroxyl group and the monomer units represented by Formula (IIf) are highly hydrophilic and are capable of adhering.

The polymeric compound for photoresist of the present invention may further comprise at least one monomer unit (constitutional repeating unit) (hereinafter may be referred to as "Monomer Unit 3") selected from the monomer units represented by Formulae (IIIa) through (IIIh), in addition to Monomer Unit 1, or in addition to Monomer Units 1 and 2.

In Formula (IIIb), the group —CO—O— in $X^1$, $X^2$ and $X^3$ may be in whichever direction. In Formula (IIIe), the straight-chain, branched-chain, cyclic or bridged cyclic hydrocarbon group (bridged cyclic group) containing 1 to 20 carbon atoms includes, but is not limited to, methyl, ethyl, propyl, isopropyl, butyl, isobutyl, t-butyl, pentyl, hexyl, octyl, decyl, dodecyl, tetradecyl, octadecyl, and other straight- or branched-chain aliphatic hydrocarbon groups (especially alkyl groups) each containing 1 to 20 carbon atoms; cyclopentyl, cyclohexyl, cyclooctyl, cyclododecyl, and other cycloalkyl or cycloalkenyl groups each containing 3 to 20 carbon atoms; bridged cyclic hydrocarbon groups each containing 6 to 20 carbon atoms corresponding to, for example, perhydroindene ring, perhydrofluorene ring, perhydronaphthalene ring (decalin ring), perhydroanthracene ring, norbornane ring, norbornene ring, pinane ring, bornane ring, isobornylane ring, tricyclo[5.2.1.0$^{2,6}$]decane ring, and tetracyclo[4.4.0.1$^{2,5}$.1$^{7,10}$]dodecane ring; tricyclo[5.2.1.0$^{2,6}$]decylmethyl group, tetracyclo[4.4.0.1$^{2,5}$.1$^{7,10}$]dodecylmethyl group, 2-norbornylmethyl group, and other groups comprising two or more of the aforementioned hydrocarbon groups combined with each other. These hydrocarbon groups may each have a substituent. Such substituents include, but are not limited to, alkyl groups, halogen atoms, hydroxyl groups which may be protected with a protecting group, hydroxymethyl groups which may be protected with a protecting group, carboxyl groups which may be protected with a protecting group (e.g., carboxyl group, t-butyloxycarbonyl group, 2-tetrahydrofuranyloxycarbonyl group, 2-tetrahydropyranyloxycarbonyl group, and 2-oxepanyloxycarbonyl group), and oxo group. As the protecting groups, those conventionally used in the field of organic synthesis can be used.

The monomer units represented by Formula (IIIa) each have a hydrophilic group (hydroxyl group, carboxyl group, or oxo group) combined with an adamantane skeleton and are capable of increasing adhesion to substrates. The monomer units represented by Formula (IIIa), those represented by Formula (IIIb) where $X^1$, $X^2$, and $X^3$ are all methylene groups, those represented by Formula (IIIc), those represented by Formula (IIIe) where $R^{37}$ is a cyclic or bridged cyclic hydrocarbon group, and those represented by Formulae (IIIg) and (IIIh) each have an alicyclic carbon skeleton and thereby contribute to improvement in, for example, transparency and resistance to etching. The monomer units each having a lactone skeleton represented by Formula (IIIb) where at least one of $X^1$, $X^2$ and $X^3$ is the group —CO—O— and those represented by Formulae (IIIc), (IIId) and (IIIg), and the monomer units represented by Formula (IIIf) and those represented by Formula (IIIh) where $R^{42}$ is a hydroxyl group, hydroxymethyl group or carboxyl group each comprise a hydrophilic group and are thereby capable of imparting adhesion. These monomer units can impart various functions to the resulting polymer according to their structures, and the balance in required properties as a resist resin can finely be adjusted by incorporating appropriate monomer units into the polymer depending on its application. Where necessary, the polymeric compound for photoresist of the present invention may further comprise other additional monomer units in addition to the aforementioned monomer units in order to adjust the properties.

The content of Monomer Unit 1 in the polymeric compound for photoresist of the present invention is, for example, from about 1% to about 90% by mole, preferably from about 5% to about 70% by mole, and more preferably from about 10% to about 50% by mole based on the total moles of the monomer units constituting the polymer. A preferred polymeric compound further comprises Monomer Unit 2 in an amount from about 5% to about 98% by mole (e.g., from about 10% to about 80% by mole) and more preferably from about 30% to about 60% by mole based on the total moles of monomer units constituting the polymer. The content of Monomer Unit 3, if any, in the polymeric compound is for example from about 1% to about 50% by mole, preferably from about 3% to about 40% by mole, and more preferably from about 5% to about 35% by mole based on the total moles of the monomer units constituting the polymer.

Typically preferred combinations of the individual monomer units in the polymeric compound of the present invention are as follows:

(1) A combination of at least one monomer unit represented by Formula (I) and at least one selected from monomer units represented by Formulae (IIa) through (IIg) (specifically, at least one selected from monomer units represented by Formulae (IIa), (IIb) and (IIc));

(2) a combination of at least one monomer unit represented by Formula (I), at least one selected from monomer units represented by Formulae (IIa) through (IIg) (specifically, at least one selected from monomer units represented by Formulae (IIa), (IIb) and (IIc)), and at least one selected from monomer units represented by Formulae (IIIa) through (IIIh) (particularly, at least one selected from monomer units represented by Formulae (IIIa), (IIIf) and (IIIh)); and (3) a combination of at least one monomer unit represented by Formula (I) and at least one selected from monomer units represented by Formulae (IIIa) through (IIIh) (particularly, at least one selected from monomer units represented by Formulae (IIIa), (IIIf) and (IIIh)).

The polymeric compound for photoresist of the present invention preferably has a solubility parameter ("SP") as determined by the Fedors method [Polym. Eng. Sci., 14, 147 (1974)] in a range from 19.5 $(J/cm^3)^{1/2}$ to 24.5 $(J/cm^3)^{1/2}$.

When a resist film is formed by applying a photoresist resin composition containing a polymeric compound having a solubility parameter in the above-specified range to a semiconductor substrate (a silicon wafer), the resulting resist film can satisfactorily adhere (be bonded) to the substrate and can be patterned with high resolution by alkaline development. If SP is less than 19.5 $(J/cm^3)^{1/2}$, the resist film may exhibit decreased adhesion to the substrate, the patterned resist may be peeled off from the substrate during development and does not remain thereon. If SP is more than 24.5 $(J/cm^3)^{1/2}$, the resin composition may be repelled by the substrate and cannot be significantly applied thereto. In addition, the resin composition may have excessively high affinity for alkaline developing solutions and may exhibit deteriorated contrast between exposed portions and unexposed portions to decrease resolution.

The polymeric compound of the present invention has a weight average molecular weight (Mw) of, for example, from about 5000 to about 50000, and preferably from about 7000 to about 20000 and a molecular weight distribution (Mw/Mn) of, for example, from about 1.8 to about 3.5, wherein Mn is a number average molecular weight (in terms of polystyrene).

Each of the monomer units represented by Formulae (IIg), (IIIf), (IIIg) and (IIIh) can be prepared by subjecting a corresponding ethylenic unsaturated compound as a comonomer to polymerization. Likewise, each of the monomer units represented by Formulae (I), (IIa) through (IIf), and (IIIa) through (IIIe) can be prepared by subjecting a corresponding (meth)acrylic acid or its ester as a (co-)monomer to polymerization. Polymerization can be performed according to a conventional procedure used in production of acrylic polymers or polyolefin polymers, such as solution polymerization or melt polymerization.

[Monomer Units of Formula (I)]

Monomers corresponding to the monomer units of Formula (I) are represented by Formula (1). When these monomers include stereoisomers, each of these stereoisomers can be used alone or in combination.

In the compounds represented by Formula (1), $R^1$, $R^2$, $R^3$, $R^4$ and $R^5$ are the same or different and are each a hydrogen atom or a methyl group. The repetition numbers m, p and q are each an integer of from 0 to 2, and n denotes 0 or 1. The hydroxyl group and the carbonyloxy group extending from the principle chain in the formula are independently combined with either of two carbon atoms on the far-left portion of the rings. Specifically, the two groups are combined with different carbon atoms, respectively. The repetition number m is preferably 0 or 1, and p plus q preferably equals 1 or 2. Particularly preferred compounds are (i) compounds where p is 1 and q is 0, (ii) compounds where p is 0 and q is 1, (iii) compounds where p is 2 and q is 0, and (iv) compounds where p is 1 and q is 1.

Typical examples of the compounds represented by Formula (1) are the following compounds:

[1-1] 8-(meth)acryloyloxy-4-oxatricyclo[5.2.1.0$^{2,6}$]decan-5-one [i.e., 9-(meth)acryloyloxy-4-oxatricyclo[5.2.1.0$^{2,6}$]decan-3-one] ($R^1$ is H or $CH_3$; m and n are 0; p is 1; q is 0; and $R^2$ and $R^3$ are H);

[1-2] 9-(meth)acryloyloxy-4-oxatricyclo[5.2.1.0$^{2,6}$]decan-5-one [i.e., 8-(meth)acryloyloxy-4-oxatricyclo[5.2.1.0$^{2,6}$]decan-3-one] ($R^1$ is H or $CH_3$; m and n are 0; p is 1; q is 0; and $R^2$ and $R^3$ are H);

[1-3] 8-(meth)acryloyloxy-9-hydroxy-4-oxatricyclo[5.2.1.0$^{2,6}$]deca n-5-one [i.e., 9-(meth)acryloyloxy-8-hydroxy-4-oxatricyclo[5.2.1.0$^{2,6}$]deca n-3-one] ($R^1$ is H or $CH_3$; m is 0; n is 1; p is 1; q is 0; and $R^2$ and $R^3$ are H);

[1-4] 9-(meth)acryloyloxy-8-hydroxy-4-oxatricyclo[5.2.1.0$^{2,6}$]deca n-5-one [i.e., 8-(meth)acryloyloxy-9-hydroxy-4-oxatricyclo[5.2.1.0$^{2,6}$]deca n-3-one] ($R^1$ is H or $CH_3$; m is 0; n is 1; p is 1; q is 0; and $R^2$ and $R^3$ are H);

[1-5] 8-(meth)acryloyloxy-3-oxatricyclo[5.2.1.0$^{2,6}$]decan-4-one ($R^1$ is H or $CH_3$; m and n are 0; p is 0; q is 1; and $R^4$ and $R^5$ are H);

[1-6] 9-(meth)acryloyloxy-3-oxatricyclo[5.2.1.0$^{2,6}$]decan-4-one ($R^1$ is H or $CH_3$; m and n are 0; p is 0; q is 1; and $R^4$ and $R^5$ are H);

[1-7] 9-(meth)acryloyloxy-4-oxatricyclo[6.2.1.0$^{2,7}$]undecan-3-one ($R^1$ is H or $CH_3$; m and n are 0; p is 2; q is 0; and $R^2$ and $R^3$ are H);

[1-8] 10-(meth)acryloyloxy-4-oxatricyclo[6.2.1.0$^{2,7}$]undecan-3-one ($R^1$ is H or $CH_3$; m and n are 0; p is 2; q is 0; and $R^2$ and $R^3$ are H);

[1-9] 9-(meth)acryloyloxy-4-oxatricyclo[6.2.1.0$^{2,7}$]undecan-5-one ($R^1$ is H or $CH_3$; m and n are 0; p is 1; q is 1; and $R^2$, $R^3$, $R^4$ and $R^5$ are H); and

[1-10] 10-(meth)acryloyloxy-4-oxatricyclo[6.2.1.0$^{2,7}$]undecan-5-one ($R^1$ is H or $CH_3$; m and n are 0; p is 1; q is 1; and $R^2$, $R^3$, $R^4$ and $R^5$ are H).

[Monomer Units of Formula (IIa)]

Monomers corresponding to the monomer units of Formula (IIa) are represented by following Formula (2a). When these monomers include stereoisomers, each of these stereoisomers can be used alone or in combination as a mixture.

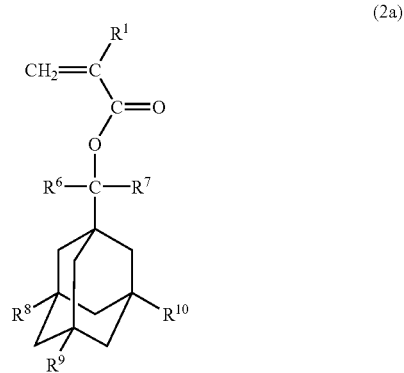

(2a)

Wherein $R^1$ is a hydrogen atom or a methyl group; $R^6$ and $R^7$ are the same or different and are each a hydrocarbon group containing 1 to 8 carbon atoms; $R^8$, $R^9$ and $R^{10}$ are the same or different and are each a hydrogen atom, a hydroxyl group or a methyl group.

Typical examples are the following compounds:

[2-1] 1-(1-(meth)acryloyloxy-1-methylethyl)adamantane ($R^1$ is H or $CH_3$; $R^6$ and $R^7$ are $CH_3$; $R^8$, $R^9$ and $R^{10}$ are H);

[2-2] 1-hydroxy-3-(1-(meth)acryloyloxy-1-methylethyl) adamantane ($R^1$ is H or $CH_3$; $R^6$ and $R^7$ are $CH_3$; $R^8$ is OH; $R^9$ and $R^{10}$ are H); [2-3] 1-(1-ethyl-1-(meth)acryloyloxypropyl)adamantane ($R^1$ is H or $CH_3$; $R^6$ and $R^7$ are $CH_2CH_3$; $R^8$, $R^9$ and $R^{10}$ are H)

[2-4] 1-hydroxy-3-(1-ethyl-1-(meth)acryloyloxypropyl)adamantane ($R^1$ is H or $CH_3$; $R^6$ and $R^7$ are $CH_2CH_3$; $R^8$ is OH; $R^9$ and $R^{10}$ are H);

[2-5] 1-(1-(meth)acryloyloxy-1-methylpropyl)adamantane ($R^1$ is H or $CH_3$; $R^6$ is $CH_3$; $R^7$ is $CH_2CH_3$; $R^8$, $R^9$ and $R^{10}$ are H);

[2-6] 1-hydroxy-3-(1-(meth)acryloyloxy-1-methylpropyl) adamantane ($R^1$ is H or $CH_3$; $R^6$ is $CH_3$; $R^7$ is $CH_2CH_3$; $R^8$ is OH; $R^9$ and $R^{10}$ are H);

[2-7] 1-(1-(meth)acryloyloxy-1,2-dimethylpropyl)adamantane ($R^1$ is H or $CH_3$; $R^6$ is $CH_3$; $R^7$ is $CH(CH_3)_2$; $R^8$, $R^9$ and $R^{10}$ are H);

[2-8] 1-hydroxy-3-(1-(meth)acryloyloxy-1,2-dimethylpropyl)adamantane ($R^1$ is H or $CH_3$; $R^6$ is $CH_3$; $R^3$ is $CH(CH_3)_2$; $R^8$ is OH; $R^9$ and $R^{10}$ are H);

[2-9] 1,3-dihydroxy-5-(1-(meth)acryloyloxy-1-methylethyl) adamantane ($R^1$ is H or $CH_3$; $R^6$ and $R^7$ are $CH_3$; $R^8$ and $R^9$ are OH; $R^{10}$ is H);

[2-10] 1-(1-ethyl)-1-(meth)acryloyloxypropyl)-3,5-dihydroxyadamantane ($R^1$ is H or $CH_3$; $R^6$ and $R^7$ are $CH_2CH_3$; $R^8$ and $R^9$ are OH; $R^{10}$ is H);

[2-11] 1,3-dihydroxy-5-(1-(meth)acryloyloxy-1-methylpropyl)adamantane ($R^1$ is H or $CH_3$; $R^6$ is $CH_3$; $R^7$ is $CH_2CH_3$; $R^8$ and $R^9$ are OH; $R^{10}$ is H); and

[2-12] 1,3-dihydroxy-5-(1-(meth)acryloyloxy-1,2-dimethylpropyl)adamantane ($R^1$ is H or $CH_3$; $R^6$ is $CH_3$; $R^7$ is $CH(CH_3)_2$; $R^8$ and $R^9$ are OH; $R^{10}$ is H).

[Monomer Units of Formula (IIb)]

Monomers corresponding to the monomer units of Formula (IIb) are represented by following Formula (2b). When these monomers include stereoisomers, each of the stereoisomers can be used alone or in combination as a mixture.

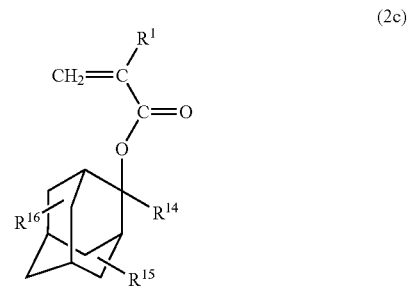

(2b)

Wherein $R^1$ is a hydrogen atom or a methyl group; and $R^{11}$ and $R^{12}$ are the same or different and are each a hydrogen atom, a hydroxyl group or a —$COOR^{13}$ group, where $R^{13}$ is a t-butyl group, a 2-tetrahydrofuranyl group, a 2-tetrahydropyranyl group or an 2-oxepanyl group.

Typical examples are the following compounds:

[2-13] 1-t-butoxycarbonyl-3-(meth)acryloyloxyadamantane ($R^1$ is H or $CH_3$; $R^{11}$ and $R^{12}$ are H; and $R^{13}$ is t-butyl group);

[2-14] 1,3-bis(t-butoxycarbonyl)-5-(meth)acryloyloxyadamantane [$R^1$ is H or $CH_3$; $R^{11}$ is t-butoxycarbonyl group; $R^{12}$ is H; and $R^{13}$ is t-butyl group];

[2-15] 1-t-butoxycarbonyl-3-hydroxy-5-(meth)acryloyloxyadamantane ($R^1$ is H or $CH_3$; $R^{11}$ is OH; $R^{12}$ is H; and $R^{13}$ is t-butyl group);

[2-16] 1-(2-tetrahydropyranyloxycarbonyl)-3-(meth)acryloyloxyadamantane ($R^1$ is H or $CH_3$; $R^{11}$ and $R^{12}$ are H; and $R^{13}$ is 2-tetrahydropyranyl group);

[2-17] 1,3-bis(2-tetrahydropyranyloxycarbonyl)-5-(meth) acryloyloxyadamantane ($R^1$ is H or $CH_3$; $R^{11}$ is 2-tetrahydropyranyloxycarbonyl group; $R^{12}$ is H; and $R^{13}$ is 2-tetrahydropyranyl group); and

[2-18] 1-hydroxy-3-(2-tetrahydropyranyloxycarbonyl)-5-(meth)acryloyloxyadamantane ($R^1$ is H or $CH_3$; $R^{11}$ is OH; $R^{12}$ is H; and $R^{13}$ is 2-tetrahydropyranyl group).

[Monomer Units of Formula (IIc)]

Monomers corresponding to the monomer units of Formula (IIc) are represented by following Formula (2c) When these monomers include stereoisomers, each of these stereoisomers can be used alone or in combination as a mixture.

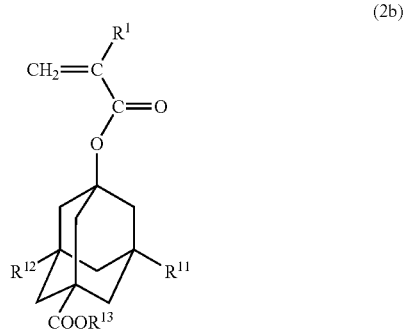

(2c)

Wherein $R^1$ is a hydrogen atom or a methyl group; $R^{14}$ is a methyl group or an ethyl group; $R^{15}$ and $R^{16}$ are the same or different and are each a hydrogen atom, a hydroxyl group or an oxo group.

Typical examples are the following compounds:

[2-19] 2-(meth)acryloyloxy-2-methyladamantane ($R^1$ is H or $CH_3$; $R^{14}$ is $CH_3$; and $R^{15}$ and $R^{16}$ are H);

[2-20] 1-hydroxy-2-(meth)acryloyloxy-2-methyladamantane ($R^1$ is H or $CH_3$; $R^{14}$ is $CH_3$; $R^{15}$ is 1-OH; and $R^{16}$ is H);

[2-21] 5-hydroxy-2-(meth)acryloyloxy-2-methyladamantane ($R^1$ is H or $CH_3$; $R^{14}$ is $CH_3$; $R^{15}$ is 5-OH; and $R^{16}$ is H);

[2-22] 1,3-dihydroxy-2-(meth)acryloyloxy-2-methyladamantane ($R^1$ is H or $CH_3$; $R^{14}$ is $CH_3$; $R^{15}$ is 1-OH; and $R^{16}$ is 3-OH);

[2-23] 1,5-dihydroxy-2-(meth)acryloyloxy-2-methyladamantane ($R^1$ is H or $CH_3$; $R^{14}$ is $CH_3$; $R^{15}$ is 1-OH; and $R^{16}$ is 5-OH);

[2-24] 1,3-dihydroxy-6-(meth)acryloyloxy-6-methyladamantane ($R^1$ is H or $CH_3$; $R^{14}$ is $CH_3$; $R^{15}$ is 1-OH; and $R^{16}$ is 3-OH);

[2-25] 2-(meth)acryloyloxy-2-ethyladamantane ($R^1$ is H or $CH_3$; $R^{14}$ is $CH_2CH_3$; and $R^{15}$ and $R^{16}$ are H);

[2-26] 1-hydroxy-2-(meth)acryloyloxy-2-ethyladamantane ($R^1$ is H or $CH_3$; $R^{14}$ is $CH_2CH_3$; $R^{15}$ is 1-OH; and $R^{16}$ is H);

[2-27] 5-hydroxy-2-(meth)acryloyloxy-2-ethyladamantane ($R^1$ is H or $CH_3$; $R^{14}$ is $CH_2CH_3$; $R^{15}$ is 5-OH; and $R^{16}$ is H);

[2-28] 1,3-dihydroxy-2-(meth)acryloyloxy-2-ethyladamantane ($R^1$ is H or $CH_3$; $R^{14}$ is $CH_2CH_3$; $R^{15}$ is 1-OH; and $R^{16}$ is 3-OH);

[2-29] 1,5-dihydroxy-2-(meth)acryloyloxy-2-ethyladamantane ($R^1$ is H or $CH_3$; $R^{14}$ is $CH_2CH_3$; $R^{15}$ is 1-OH; and $R^{16}$ is 5-OH); and

[2-30] 1,3-dihydroxy-6-(meth)acryloyloxy-6-ethyladamantane ($R^1$ is H or $CH_3$; $R^{14}$ is $CH_2CH_3$; $R^{15}$ is 1-OH; and $R^{16}$ is 3-OH).

[Monomer Units of Formula (IId)]

Monomers corresponding to the monomer units of Formula (IId) are represented by following Formula (2d). When these monomers include stereoisomers, each of the stereoisomers can be used alone or in combination as a mixture.

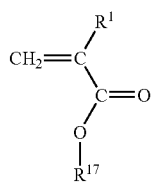

(2d)

Wherein $R^1$ is a hydrogen atom or a methyl group; $R^{17}$ is a hydrocarbon group having a tertiary carbon atom at the bonding site with the oxygen atom indicated in the formula.

A typical example is the following compound:

[2-31] t-butyl (meth)acrylate ($R^1$ is H or $CH_3$, and $R^{17}$ is t-butyl group).

[Monomer Units of Formula (IIe)]

Monomers corresponding to the monomer units of Formula (IIe) are represented by following Formula (2e). When these monomers include stereoisomers, each of the stereoisomers can be used alone or in combination as a mixture.

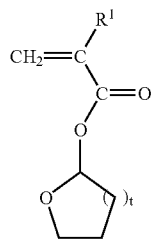

(2e)

Wherein $R^1$ is a hydrogen atom or a methyl group; and t denotes an integer of from 1 to 3.

Typical examples are the following compounds:

[2-32] 2-tetrahydropyranyl (meth)acrylate ($R^1$ is H or $CH_3$; and t is 2); and

[2-33] 2-tetrahydrofuranyl (meth)acrylate ($R^1$ is H or $CH_3$; and t is 1).

[Monomer Units of Formula (IIf)]

Monomers corresponding to the monomer units of Formula (IIf) are represented by following Formula (2f). When these monomers include stereoisomers, each of the stereoisomers can be used alone or in combination as a mixture.

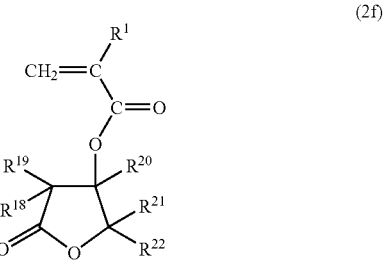

(2f)

Wherein $R^1$ is a hydrogen atom or a methyl group; $R^{18}$ through $R^{22}$ are the same or different and are each a hydrogen atom or a methyl group.

Typical examples are the following compounds:

[2-34] β-(meth)acryloyloxy-γ-butyrolactone ($R^1$ is H or $CH_3$; $R^{18}$, $R^{19}$, $R^{20}$, $R^{21}$ and $R^{22}$ are H);

[2-35] β-(meth)acryloyloxy-α,α-dimethyl-γ-butyrolactone ($R^1$ is H or $CH_3$; $R^{18}$ and $R^{19}$ are $CH_3$; $R^{20}$, $R^{21}$ and $R^{22}$ are H);

[2-36] β-(meth)acryloyloxy-γ,γ-dimethyl-γ-butyrolactone ($R^1$ is H or $CH_3$; $R^{21}$ and $R^{22}$ are $CH_3$; $R^{18}$, $R^{19}$ and $R^{20}$ are H);

[2-37] β-(meth)acryloyloxy-α,α,β-trimethyl-γ-butyrolactone ($R^1$ is H or $CH_3$; $R^{18}$, $R^{19}$ and $R^{20}$ are $CH_3$; and $R^{21}$ and $R^{22}$ are H);

[2-38] β-(meth)acryloyloxy-β,γ,γ-trimethyl-γ-butyrolactone ($R^1$ is H or $CH_3$; $R^{20}$, $R^{21}$ and $R^{22}$ are $CH_3$; $R^{18}$ and $R^{19}$ are H); and

[2-39] β-(meth)acryloyloxy-α,α,β,γ,γ-pentamethyl-γ-butyrolactone ($R^1$ is H or $CH_3$; and $R^{18}$, $R^{19}$, $R^{20}$, $R^{21}$ and $R^{22}$ are $CH_3$).

[Monomer Units of Formula (IIg)]

Monomers corresponding to the monomer units of Formula (IIg) are represented by following Formula (2g). When these monomers include stereoisomers, each of the stereoisomers can be used alone or in combination as a mixture.

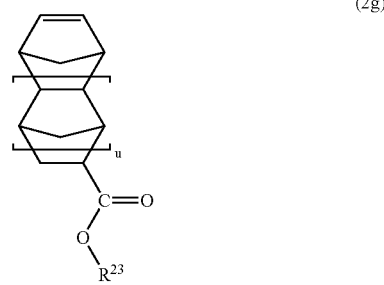

(2g)

Wherein $R^{23}$ is a t-butyl group, a 2-tetrahydrofuranyl group, a 2-tetrahydropyranyl group or an 2-oxepanyl group; and u denotes 0 or 1.

Typical examples are the following compounds:

[2-40] 5-t-butoxycarbonylnorbornene ($R^{23}$ is a t-butyl group; and u is 0);

[2-41] 9-t-butoxycarbonyltetracyclo[6.2.1.1[3, 6].0[2, 7]]dodec-4-ene ($R^{23}$ is a t-butyl group; and u is 1);

[2-42] 5-(2-tetrahydropyranyloxycarbonyl)norbornene ($R^{23}$ is 2-tetrahydropyranyl group; and u is 0); and

[2-43] 9-(2-tetrahydropyranyloxycarbonyl)tetracyclo[6.2.1.1$^{3,6}$.0$^{2,7}$]dodec-4-ene (R$^{23}$ is 2-tetrahydropyranyl group; and u is 1).

[Monomer Units of Formula (IIIa)]

Monomers corresponding to the monomer units of Formula (IIIa) are represented by following Formula (3a). When these monomers include stereoisomers, each of the stereoisomers can be used alone or in combination as a mixture.

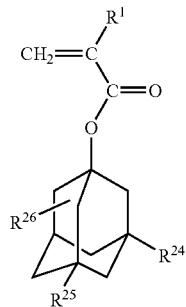

(3a)

Wherein R$^1$ is a hydrogen atom or a methyl group; R$^{24}$ and R$^{25}$ are the same or different and are each a hydrogen atom, a hydroxyl group or a carboxyl group; and R$^{26}$ is a hydroxyl group, an oxo group or a carboxyl group.

Typical examples are the following compounds:

[3-1] 1-hydroxy-3-(meth)acryloyloxyadamantane (R$^1$ is H or CH$_3$; R$^{26}$ is OH; R$^{24}$ and R$^5$ are H);

[3-2] 1,3-dihydroxy-5-(meth)acryloyloxyadamantane (R$^1$ is H or CH$_3$; R$^{26}$ and R$^{24}$ are OH; and R$^{25}$ is H);

[3-3] 1-carboxy-3-(meth)acryloyloxyadamantane (R$^1$ is H or CH$_3$; R$^{26}$ is COOH; R$^{24}$ and R$^{25}$ are H);

[3-4] 1,3-dicarboxy-5-(meth)acryloyloxyadamantane (R$^1$ is H or CH$_3$; R$^{26}$ and R$^{24}$ are COOH; and R$^{25}$ is H);

[3-5] 1-carboxy-3-hydroxy-5-(meth)acryloyloxyadamantane (R$^1$ is H or CH$_3$; R$^{26}$ is OH; R$^{24}$ is COOH; and R$^{25}$ is H);

[3-6] 1-(meth)acryloyloxy-4-oxoadamantane (R$^1$ is H or CH$_3$; R$^{26}$ is 4-oxo group; R$^{24}$ and R$^{25}$ are H);

[3-7] 3-hydroxy-1-(meth)acryloyloxy-4-oxoadamantane (R$^1$ is H or CH$_3$; R$^{26}$ is 4-oxo group; R$^{24}$ is 3-OH; and R$^{25}$ is H); and

[3-8] 7-hydroxy-1-(meth)acryloyloxy-4-oxoadamantane (R$^1$ is H or CH$_3$; R$^{26}$ is 4-oxo group; R$^{24}$ is 7-OH; and R$^{25}$ is H).

[Monomer Units of Formula (IIIb)]

Monomers corresponding to the monomer units of Formula (IIIb) are represented by following Formula (3b). When these monomers include stereoisomers, each of the stereoisomers can be used alone or in combination as a mixture.

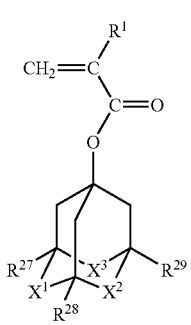

(3b)

Wherein R$^1$ is a hydrogen atom or a methyl group; X$^1$, X$^2$ and X$^3$ are the same or different and are each —CH$_2$— or —CO—O—; and R$^{27}$, R$^{28}$ and R$^{29}$ are the same or different and are each a hydrogen atom or a methyl group.

Typical examples of the compounds represented by Formula (3b) are the following compounds:

[3-9] 1-(meth)acryloyloxy-4-oxatricyclo[4.3.1.1$^{3,8}$]undecan-5-one (R$^1$ is H or CH$_3$; R$^{27}$, R$^{28}$ and R$^{29}$ are H; X$^2$ is —CO—O— where the left side of the group faces a carbon atom with which R$^{28}$ is combined; and X$^1$ and X$^3$ are —CH$_2$—);

[3-10] 1-(meth)acryloyloxy-4,7-dioxatricyclo[4.4.1.1$^{3,9}$]dodecane-5,8-dione (R$^1$ is H or CH$_3$; R$^{27}$, R$^{28}$ and R$^{29}$ are H; X$^1$ is —CO—O— where the left side of the group faces a carbon atom with which R$^{27}$ is combined; X$^2$ is —CO—O— where the left side of the group faces a carbon atom with which R$^{28}$ is combined; and X$^3$ is —CH$_2$—);

[3-11] 1-(meth)acryloyloxy-4,8-dioxatricyclo[4.4.1.1$^{3,9}$]dodecane-5,7-dione (R$^1$ is H or CH$_3$; R$^{27}$, R$^{28}$ and R$^{29}$ are H; X$^1$ is —O—CO— where the left side of the group faces a carbon atom with which R$^{27}$ is combined; X$^2$ is —CO—O— where the left side of the group faces a carbon atom with which R$^{28}$ is combined; and X$^3$ is —CH$_2$—) and

[3-12] 1-(meth)acryloyloxy-5,7-dioxatricyclo[4.4.1.1$^{3,9}$]dodecane-4,8-dione (R$^1$ is H or CH$_3$; R$^{27}$, R$^{28}$ and R$^{29}$ are H; X$^1$ is —CO—O— where the left side of the group faces a carbon atom with which R$^{27}$ is combined; X$^2$ is —O—CO— where the left side of the group faces a carbon atom with which R$^{28}$ is combined; and X$^3$ is —CH$_2$—).

[Monomer Units of Formula (IIIc)]

Monomers to form the monomer units of Formula (IIIc) are represented by following Formula (3c). When these monomers include stereoisomers, each of the stereoisomers can be used alone or in combination as a mixture.

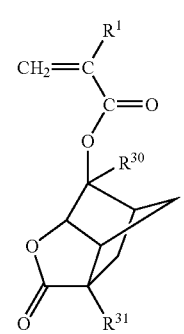

(3c)

Wherein R$^1$ is a hydrogen atom or a methyl group; and R$^{30}$ and R$^{31}$ are the same or different and are each a hydrogen atom or a methyl group.

Typical examples are the following compounds:

[3-13] 2-(meth)acryloyloxy-4-oxatricyclo[4.2.1.0$^{3,7}$]nonan-5-one (R$^1$ is H or CH$_3$; R$^{30}$ and R$^{31}$ are H); and

[3-14] 2-(meth)acryloyloxy-2-methyl-4-oxatricyclo[4.2.1.0$^{3,7}$]nonan-5-one (R$^1$ is H or CH$_3$; R$^{30}$ is CH$_3$; and R$^{31}$ is H).

[Monomer Units of Formula (IIId)]

Monomers to form the monomer units of Formula (IIId) are represented by following Formula (3d). When these monomers include stereoisomers, each of the stereoisomers can be used alone or in combination as a mixture.

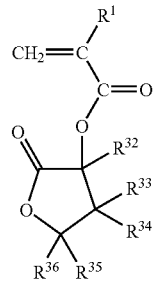

(3d)

Wherein $R^1$ is a hydrogen atom or a methyl group; and $R^{32}$, $R^{33}$, $R^{34}$, $R^{35}$ and $R^{36}$ are the same or different and are each a hydrogen atom or a methyl group.

Typical examples thereof include the following compounds:

[3-15] α-(meth)acryloyloxy-γ-butyrolactone ($R^1$ is H or $CH_3$; and $R^{32}$, $R^{33}$, $R^{34}$, $R^{35}$ and $R^{36}$ are H);

[3-16] α-(meth)acryloyloxy-α-methyl-γ-butyrolactone ($R^1$ is H or $CH_3$; $R^{32}$ is $CH_3$; and $R^{33}$, $R^{34}$, $R^{35}$ and $R^{36}$ are H);

[3-17] α-(meth)acryloyloxy-β,β-dimethyl-γ-butyrolactone ($R^1$ is H or $CH_3$; $R^{32}$, $R^{35}$ and $R^{36}$ are H; and $R^{33}$ and $R^{34}$ are $CH_3$)

[3-18] α-(meth)acryloyloxy-α,β,β-trimethyl-γ-butyrolactone ($R^1$ is H or $CH_3$; $R^{32}$, $R^{33}$ and $R^{34}$ are $CH_3$; and $R^{35}$ and $R^{36}$ are H));

[3-19] α-(meth)acryloyloxy-γ,γ-dimethyl-γ-butyrolactone ($R^1$ is H or $CH_3$; $R^{35}$ and $R^{36}$ are $CH_3$; and $R^{32}$, $R^{33}$ and $R^{34}$ are H);

[3-20] α-(meth)acryloyloxy-α,γ,γ-trimethyl-γ-butyrolactone ($R^1$ is H or $CH_3$; $R^{32}$, $R^{35}$ and $R^{36}$ are $CH_3$; and $R^{33}$ and $R^{34}$ are H);

[3-21] α-(meth)acryloyloxy-β,β,γ,γ-tetramethyl-γ-butyrolactone ($R^1$ is H or $CH_3$; $R^{33}$, $R^{34}$, $R^{35}$ and $R^{36}$ are $CH_3$; and $R^{32}$ is H); and

[3-22] α-(meth)acryloyloxy-α,β,β,γ,γ-pentamethyl-γ-butyrolactone ($R^1$ is H or $CH_3$; and $R^{32}$, $R^{33}$, $R^{34}$, $R^{35}$ and $R^{36}$ are $CH_3$).

[Monomer Units of Formula (IIIe)]

Monomers to form the monomer units of Formula (IIIe) are represented by following Formula (3e). When these monomers include stereoisomers, each of the stereoisomers can be used alone or in combination as a mixture.

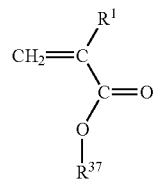

(3e)

Wherein $R^1$ is a hydrogen atom or a methyl group; and $R^{37}$ is a hydrogen atom or a straight-chain, branched-chain, cyclic or bridged cyclic hydrocarbon group containing 1 to 20 carbon atoms which may have a substituent.

Typical examples thereof include the following compounds:

[3-23] (meth)acrylic acid ($R^1$ is H or $CH_3$; and $R^{37}$ is H);

[3-24] methyl (meth)acrylate ($R^1$ is H or $CH_3$; and $R^{37}$ is methyl group);

[3-25] ethyl (meth)acrylate ($R^1$ is H or $CH_3$; and $R^{37}$ is ethyl group);

[3-26] isopropyl (meth)acrylate ($R^1$ is H or $CH_3$; and $R^{37}$ is isopropyl group);

[3-27] n-butyl (meth)acrylate ($R^1$ is H or $CH_3$; and $R^{37}$ is n-butyl group);

[3-28] cyclohexyl (meth)acrylate ($R^1$ is H or $CH_3$; and $R^{37}$ is cyclohexyl group);

[3-29] decahydronaphthyl (meth)acrylate ($R^1$ is H or $CH_3$; and $R^{37}$ is decahydronaphthyl group);

[3-30] norbornyl (meth)acrylate ($R^1$ is H or $CH_3$; and $R^{37}$ is norbornyl group);

[3-31] isobornyl (meth)acrylate ($R^1$ is H or $CH_3$; and $R^{37}$ is isobornyl group);

[3-32] adamantyl (meth)acrylate ($R^1$ is H or $CH_3$; and $R^{37}$ is adamantyl group);

[3-33] dimethyladamantyl (meth)acrylate ($R^1$ is H or $CH_3$; and $R^{37}$ is dimethyladamantyl group);

[3-34] tricyclo[5.2.1.0$^{2,6}$]decyl (meth)acrylate ($R^1$ is H or $CH_3$; and $R^{37}$ is tricyclo[5.2.1.0$^{2,6}$]decyl group); and

[3-35] tetracyclo[4.4.0.1$^{2,5}$.1$^{7,10}$]dodecyl (meth)acrylate ($R^1$ is H or $CH_3$; and $R^{37}$ is tetracyclo[4.4.0.1$^{2,5}$.1$^{7,10}$]dodecyl group).

Compounds corresponding to these compounds wherein a substituent such as hydroxyl group, hydroxymethyl group, carboxyl group or oxo group is combined with a group corresponding to $R^{37}$ are also preferred.

[Monomer Unit of Formula (IIIf)]

A monomer to form the monomer unit of Formula (IIIf) is represented by following Formula (3f).

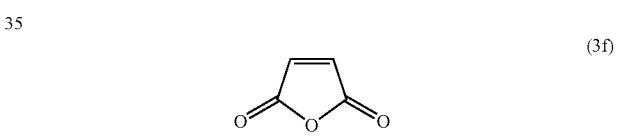

(3f)

[3-36] maleic anhydride.

[Monomer Units of Formula (IIIg)]

Monomers to form the monomer units of Formula (IIIg) are represented by following Formula (3g). When these monomers include stereoisomers, each of the stereoisomers can be used alone or in combination as a mixture.

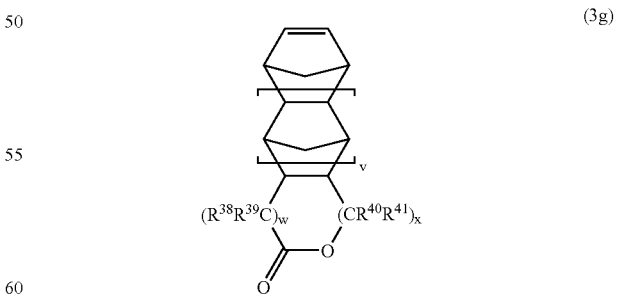

(3g)

Wherein $R^{38}$, $R^{39}$, $R^{40}$ and $R^{41}$ are the same or different and are each a hydrogen atom or a methyl group; and v, w and x each denote 0 or 1.

Typical examples of the compounds represented by Formula (3g) are the following compounds:

[3-37] 4-oxatricyclo[5.2.1.0$^{2,\ 6}$]dec-8-en-5-one [i.e., 4-oxatricyclo[5.2.1.0$^{2,\ 6}$]dec-8-en-3-one] ($R^{40}$ and $R^{41}$ are H; v and w are 0; and x is 1);

[3-38] 3-oxatricyclo[5.2.1.0$^{2,\ 6}$]dec-8-en-4-one ($R^{38}$ and $R^{39}$ are H; v and x are 0; and w is 1);

[3-39] 5-oxatricyclo[6.2.1.0$^{2,\ 7}$]undec-9-en-6-one ($R^{40}$ and $R^{41}$ are H; v and w are 0; and x is 2);

[3-40] 4-oxatricyclo[6.2.1.0$^{2,\ 7}$]undec-9-en-5-one ($R^{38}$, $R^{39}$, $R^{40}$ and $R^{41}$ are H; v is 0; w and x are 1);

[3-41] 4-oxapentacyclo[6.5.1.1$^{9,\ 12}$.0$^{2,\ 6}$.0$^{8,\ 13}$]pentadec-10-en-5-one ($R^{40}$ and $R^{41}$ are H; v is 1; w is 0; and x is 1);

[3-42] 3-oxapentacyclo[6.5.1.1$^{9,\ 12}$.0$^{2,\ 6}$.0$^{8,\ 13}$]pentadec-10-en-4-one ($R^{38}$ and $R^{39}$ are H; v is 1; w is 1; and x is 0);

[3-43] 5-oxapentacyclo[6.6.1.1$^{10,\ 13}$.0$^{2,\ 7}$.0$^{9,\ 14}$]hexadec-11-en-6-one ($R^{40}$ and $R^{41}$ are H; v is 1; w is 0; and x is 2); and

[3-44] 4-oxapentacyclo[6.6.1.1$^{10,\ 13}$.0$^{2,\ 7}$.0$^{9,\ 14}$]hexadec-11-en-5-one ($R^{38}$, $R^{39}$, $R^{40}$ and $R^{41}$ are H; v is 1; w and x are 1).

These compounds can be obtained according to known procedures or procedures pursuant thereto. For example, the compound [3-37] can be obtained, for example, by Diels-Alder reaction between cyclopentadiene and 2, 5-dihydrofuran-2-one. The compounds [3-38], [3-39] and [3-40] can be obtained according to the procedures described in J. Org. Chem. 41, 7, pp. 1221 (1976), J. Org. Chem., 50, 25, pp. 5193 (1985), and Tetrahedron Lett. pp. 4099 (1976), respectively. The compounds [3-41], [3-42], [3-43] and [3-44] can be obtained, for example, by Diels-Alder reaction between the compounds [3-37], [3-38], [3-39] and [3-40] or derivatives thereof and cyclopentadiene, respectively.

[Monomer Units of Formula (IIIh)]

Monomers to form the monomer units of Formula (IIIh) are represented by following Formula (3h). When these monomers include stereoisomers, each of the stereoisomers can be used alone or in combination as a mixture.

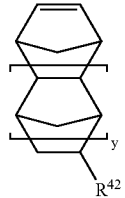

(3h)

Wherein $R^{42}$ is a hydrogen atom, a hydroxyl group, a hydroxymethyl group or a carboxyl group; and y denotes 0 or 1.

Typical examples thereof are the following compounds:

[3-45] norbornene ($R^{42}$ is H; and y is 0); and

[3-46] 5-hydroxy-2-norbornene ($R^{42}$ is OH; and y is 0).

The resin composition for photoresist of the present invention comprises the polymeric compound for photoresist of the present invention and a photosensitive acid generator.

Such photosensitive acid generators include conventional or known compounds that efficiently generate an acid upon irradiation with light. Such compounds include, but are not limited to, diazonium salts, iodonium salts (e.g., diphenyliodonium hexafluorophosphate), sulfonium salts (e.g., triphenylsulfonium hexafluoroantimonate, triphenylsulfonium hexafluorophosphate, and triphenylsulfonium methanesulfonate), sulfonic acid esters [e.g., 1-phenyl-1-(4-methylphenyl)sulfonyloxy-1-benzoylmethane, 1,2,3-trisulfonyloxymethylbenzene, 1,3-dinitro-2-(4-phenylsulfonyloxymethyl)benzene, and 1-phenyl-1-(4-methylphenylsulfonyloxymethyl)-1-hydroxy-1-b enzoylmethane], oxathiazol derivatives, s-triazine derivatives, disulfone derivatives (e.g., diphenyldisulfone), imide compounds, oxime sulfonates, diazonaphthoquinone, and benzoin tosylate. Each of these photosensitive acid generators can be used alone or in combination.

The amount of the photosensitive acid generator can appropriately be selected depending on the strength of the acid generated by light irradiation, the proportions of the individual constitutional repeating units in the polymeric compound and other factors and is, for example, from about 0.1 to about 30 parts by weight, preferably from about 1 to about 25 parts by weight, and more preferably from about 2 to 20 parts by weight, relative to 100 parts by weight of the polymeric compound.

The photoresist resin composition may further comprise additional components. Such additional components include, but are not limited to, alkali-soluble resins (e.g., novolak resins, phenol resins, imide resins, and carboxyl-group-containing resins), and other alkali-soluble components, coloring agents (e.g., dyestuffs), and organic solvents (e.g., hydrocarbons, halogenated hydrocarbons, alcohols, esters, amides, ketones, ethers, Cellosolves, Carbitols, glycol ether esters, and mixtures of these solvents).

The photoresist resin composition is applied to a base or a substrate, is dried, and the resulting film (resist film) is exposed to light through a predetermined mask (or is further subjected to post-exposure baking) to form a latent image pattern, and the film is then developed to yield a fine pattern with a high degree of precision.

Such bases or substrates include, for example, silicon wafers, metals, plastics, glass, and ceramics. The photoresist resin composition can be applied using a conventional application means such as a spin coater, a dip coater, and a roller coater. The applied film has a thickness of, for example, from about 0.1 to about 20 μm, and preferably from about 0.3 to about 2 μm.

Light rays with different wavelengths such as ultraviolet rays and X-rays can be used in exposure. For example, g-line, i-line, and excimer laser (e.g., XeCl, KrF, KrCl, ArF, or ArCl excimer laser) are usually used for semiconductor resists. An exposure energy is, for example, from about 1 to about 1000 mJ/cm$^2$, and preferably from about 10 to about 500 mJ/cm$^2$.

Light irradiation allows the photosensitive acid generator to generate an acid, and the acid allows, for example, the protecting group (leaving group) of a carboxyl group of an alkali-soluble unit of the polymeric compound to leave promptly and thereby yields a carboxyl group that contributes to solubilization. Subsequent development with water or an alkaline developing solution can yield a predetermined pattern with a high degree of precision.

[Production of (Meth)acrylic Ester Derivatives Represented by Formula (1)]

Each of the (meth)acrylic ester derivatives represented by Formula (1) can be obtained by allowing a corresponding cyclic alcohol-represented by Formula (4) to react with (meth)acrylic acid or its reactive derivative.

Such reactive derivatives of (meth)acrylic acid include, but are not limited to, methyl (meth)acrylate, ethyl (meth)acrylate, t-butyl (meth)acrylate, vinyl (meth)acrylate, allyl (meth)acrylate, and other (meth)acrylic esters; (meth)acryloyl chloride, (meth)acryloyl bromide, and other (meth) acryloyl halides; (meth)acrylic anhydrides; and active esters of (meth) acrylic acid.

The reaction between the cyclic alcohol represented by Formula (4) and (meth) acrylic acid or its reactive derivative can be performed according to a conventional esterification reaction. More specifically, for example, a reaction between the cyclic alcohol represented by Formula (4) and a (meth) acryloyl halide is performed in the presence of, or in the absence of, a solvent in the presence of a base. Such solvents include, but are not limited to, methylene chloride, dichloroethane, and other halogenated hydrocarbons; toluene and other aromatic hydrocarbons; hexane and other aliphatic hydrocarbons; cyclohexane and other alicyclic hydrocarbons; and mixtures of these solvents. The base includes, but is not limited to, triethylamine and other tertiary amines, pyridine and other basic nitrogen-containing heterocyclic compounds, and other organic bases; sodium carbonate, sodium hydrogencarbonate, and other inorganic bases. The amount of the (meth)acryloyl halide is, for example, from about 0.9 to about 1.8 moles, and preferably from about 0.95 to about 1.4 moles per mole of the cyclic alcohol represented by Formula (4). A reaction temperature is, for example, from about −10° C. to about 80° C.

The resulting (meth)acrylic ester derivative can be separated and purified by separation means such as filtration, concentration, distillation, extraction, crystallization, recrystallization and column chromatography, or any combination thereof.

[Cyclic Alcohols Represented by Formula (4) and Production Thereof]

In the cyclic alcohols represented by Formula (4), $R^2$, $R^3$, $R^4$ and $R^5$ are the same or different and are each a hydrogen atom or a methyl group; and the repetition numbers m, p and q are each an integer of from 0 to 2. Hydroxyl groups in the formula are independently combined with either of two carbon atoms on the far-left side of the rings. When there are plural hydroxyl groups, they are combined with different carbon atoms, respectively. The repetition number m is preferably 0 or 1, and p plus q preferably equals 1 or 2. Particularly preferred compounds are (i) compounds where p is 1 and q is 0, (ii) compounds where p is 0 and q is 1, (iii) compounds where p is 2 and q is 0, and (iv) compounds where p is 1 and q is 1. The cyclic alcohols represented by Formula (4a) correspond to cyclic alcohols represented by Formula (4) where n is 0. The compounds represented by Formula (4b) correspond to compounds represented by Formula (4a) where p and q are specific numerical values.

Typical examples of the cyclic alcohols represented by Formula (4) include the following compounds:

[4-1] 8-hydroxy-4-oxatricyclo[5.2.1.0$^{2,6}$]decan-5-one [i.e., 9-hydroxy-4-oxatricyclo[5.2.1.0$^{2,6}$]decan-3-one] (m and n are 0; p is 1; q is 0; and $R^2$ and $R^3$ are H);

[4-2] 9-hydroxy-4-oxatricyclo[5.2.1.0$^{2,6}$]decan-5-one [i.e., 8-hydroxy-4-oxatricyclo[5.2.1.0$^{2,6}$]decan-3-one] (m and n are 0; p is 1; q is 0; and $R^2$ and $R^3$ are H)

[4-3] 8,9-dihydroxy-4-oxatricyclo[5.2.1.0$^{2,6}$]decan-5-one [i.e., 8,9-dihydroxy-4-oxatricyclo[5.2.1.0$^{2,6}$]decan-3-one] (m is 0; n is 1; p is 1; q is 0; and $R^2$ and $R^3$ are H);

[4-4] 8-hydroxy-3-oxatricyclo[5.2.1.0$^{2,6}$]decan-4-one (m and n are 0; p is 0; q is 1; and $R^4$ and $R^5$ are H);

[4-5] 9-hydroxy-3-oxatricyclo[5.2.1.0$^{2,6}$]decan-4-one (m and n are 0; p is 0; q is 1; and $R^4$ and $R^5$ are H);

[4-6] 9-hydroxy-4-oxatricyclo[6.2.1.0$^{2,7}$]undecan-3-one (m and n are 0; p is 2; q is 0; and $R^2$ and $R^3$ are H);

[4-7] 10-hydroxy-4-oxatricyclo[6.2.1.0$^{2,7}$]undecan-3-one (m and n are 0; p is 2; q is 0; and $R^2$ and $R^3$ are H);

[4-8] 9-hydroxy-4-oxatricyclo[6.2.1.0$^{2,7}$]undecan-5-one (m and n are 0; p is 1; q is 1; and $R^2$, $R^3$, $R^4$ and $R^5$ are H); and

[4-9] 10-hydroxy-4-oxatricyclo[6.2.1.0$^{2,7}$]undecan-5-one (m and n are 0; p is 1; q is 1; and $R^2$, $R^3$, $R^4$ and $R^5$ are H).

Each of the cyclic alcohols represented by Formula (4a) can be obtained by reducing a corresponding epoxy compound represented by Formula (5).

Reducing agents for use in reduction include, for example, hydrogen, alkali (or alkaline earth) metals/ammonia, lithium aluminium hydride, and boranes. The reduction reaction can be preformed according to a conventional procedure depending on the type of the reducing agent. More specifically, when hydrogen is used as the reducing agent, the cyclic alcohol represented by Formula (4a) is dissolved in an appropriate solvent such as methanol and is allowed to react with hydrogen in the presence of a platinum group metal catalyst (hydrogenation catalyst) such as Pd/C. A reaction temperature is, for example, from about 0° C. to about 100° C. The reaction is generally performed at atmospheric pressure or under a pressure (under a load). A reaction system can be whichever of batch system, semi-batch system and continuous system.

The resulting cyclic alcohol represented by Formula (4a) can be separated and purified, for example, by separation means such as filtration, concentration, distillation, extraction, crystallization, recrystallization and column chromatography, or any combination thereof.

Among cyclic alcohols represented by Formula (4), compounds in which n is 1 can be obtained by allowing a cyclic compound represented by Formula (6) having an unsaturated bond mentioned later to react with an oxidizing agent such as potassium permanganate. The reaction can be performed under conditions usually employed in oxidation with potassium permanganate.

[Epoxy Compounds Represented by Formula (5) and Production Thereof]

In the epoxy compounds represented by Formula (5), $R^2$, $R^3$, $R^4$ and $R^5$ are the same or different and are each a hydrogen atom or a methyl group; and the repetition numbers m, p and q are each an integer of from 0 to 2. The repetition number m is preferably 0 or 1, and p plus q preferably equals 1 or 2. Particularly preferred compounds are (i) compounds where p is 1 and q is 0, (ii) compounds where p is 0 and q is 1, (iii) compounds where p is 2 and q is 0, and (iv) compounds where p is 1 and q is 1.

Typical examples of the epoxy compounds represented by Formula (5) are the following compounds:

[5-1] 8,9-epoxy-4-oxatricyclo[5.2.1.0$^{2,6}$]decan-3-one;

[5-2] 8,9-epoxy-3-oxatricyclo[5.2.1.0$^{2,6}$]decan-4-one;

[5-3] 9,10-epoxy-4-oxatricyclo[6.2.1.0$^{2,7}$]undecan-3-one; and

[5-4] 9,10-epoxy-4-oxatricyclo[6.2.1.0$^{2,7}$]undecan-5-one.

Each of the epoxy compounds represented by Formula (5) can be obtained by allowing a corresponding cyclic compound having an unsaturated bond represented by following Formula (6):

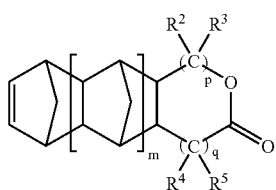

(6)

wherein $R^2$, $R^3$, $R^4$ and $R^5$ are the same or different and are each a hydrogen atom or a methyl group; and m, p and q are each an integer of from 0 to 2, to react with an epoxidizing agent.

Such epoxidizing agents include known epoxidizing agents such as peroxybenzoic acid, m-chloroperoxybenzoic acid, monoperoxyphthalic acid, trifluoroperoxyacetic acid, peroxyacetic acid, and other peroxoacids; dioxysilane and other peroxides; hydroperoxides (e.g., t-butyl hydroperoxide, cumene hydroperoxide, and hydrogen peroxide) in the presence of metal catalysts (e.g., vanadium compounds, molybdenum compounds, tungsten compounds, and titanium compounds); oxygen in the presence of metal catalysts (e.g., iron compounds) or imide compound catalysts (e.g., N-hydroxyphthalimide); enzymes or microorganisms.

The epoxidation reaction can be performed according to a conventional procedure depending on the type of the epoxidizing agent. More specifically, when a peroxoacid such as peroxyacetic acid is used as the epoxidizing agent, the cyclic compound having an unsaturated bond represented by Formula (6) is dissolved in an appropriate solvent such as ethyl acetate or methylene chloride and is treated with the peroxoacid. A reaction temperature is, for example, from about −20° C. to about 100° C. The reaction can be performed in whichever of batch system, semi-batch system and continuous system.

The resulting epoxy compound represented by Formula (5) can be separated and purified, for example, by separation means such as filtration, concentration, distillation, extraction, crystallization, recrystallization and column chromatography, or any combination thereof.

[Production of Cyclic Compounds Represented by Formula (6) Having Unsaturated Bond]

The cyclic compounds represented by Formula (6) each having an unsaturated bond can be obtained according to a known procedure utilizing Diels-Alder reaction or a procedure analogous thereto. For example, a compound of Formula (6) in which $R^2$ and $R^3$ are hydrogen atoms, m is 0, p is 1, and q is 0 (i.e., 4-oxatricyclo[5.2.1.0$^{2,6}$]dec-8-en-3-one) can be obtained by reducing a product of Diels-Alder reaction between cyclopentadiene and maleic anhydride with a reducing agent such as sodium borohydride.

Alternatively, 4-oxatricyclo[5.2.1.0$^{2,6}$]dec-8-en-3-one (6a) can be obtained by allowing dicyclopentadiene represented by Formula (7) or cyclopentadiene represented by Formula (8) to react with β-hydroxy-γ-butyrolactone represented by Formula (9) or 2(5H)-furanone represented by Formula (10), as shown in the following reaction process chart. In this procedure, dicyclopentadiene represented by Formula (7) and cyclopentadiene represented by Formula (8) can be used in combination. Likewise, β-hydroxy-γ-butyrolactone represented by Formula (9) and 2(5H)-furanone represented by Formula (10) can be used in combination. It is also acceptable that dicyclopentadiene represented by Formula (7) is heated and decomposed and thereby yields cyclopentadiene, and cyclopentadiene formed is allowed to react with β-hydroxy-γ-butyrolactone represented by Formula (9) or 2(5H)-furanone represented by Formula (10), and that β-hydroxy-γ-butyrolactone represented by Formula (9) is heated and dehydrated to yield 2(5H)-furanone, and 2(5H)-furanone formed is allowed to react with dicyclopentadiene represented by Formula (7) or cyclopentadiene represented by Formula (8).

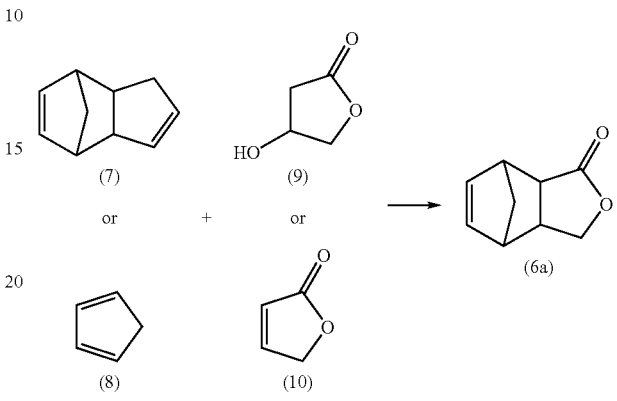

The aforementioned reaction is performed in the presence of, or in the absence of, a solvent. Such solvent include, but are not limited to, ethyl acetate and other esters; acetic acid and other organic acids; t-butyl alcohol and other alcohols; chloroform, dichloromethane, 1,2-dichloroethane, and other halogenated hydrocarbons; benzene and other aromatic hydrocarbons; hexane, heptane, octane, and other aliphatic hydrocarbons; cyclohexane and other alicyclic hydrocarbons; N,N-dimethylformamide, N,N-dimethylacetamide, and other amides; acetonitrile, propionitrile, benzonitrile, and other nitriles; ethyl ether, tetrahydrofuran, and other chain or cyclic ethers. Each of these solvents can be used alone or in combination. A reaction temperature can appropriately be selected depending on the type of reaction raw materials and other factors and is generally from about 50° C. to about 300° C., and preferably from about 100° C. to about 250° C. The reaction is performed at atmospheric pressure or under a pressure (under a load) in any system such as batch system, semi-batch system, or continuous system. Formed 4-oxatricyclo[5.2.1.0$^{2,6}$]dec-8-en-3-one (6a) can be separated and purified, for example, by separation means such as filtration, concentration, distillation, extraction, crystallization, recrystallization and column chromatography, or any combination thereof.

INDUSTRIAL APPLICABILITY

The polymeric compounds for photoresist of the present invention each contain a monomer unit having a specific structure comprising an alicyclic skeleton and a lactone ring condensed thereto. When they are used as a base for photoresist, the resulting photoresists exhibit high resistance to etching and have well-rounded functions required as photoresists, such as adhesion to substrates, solubility in solvents and affinity for alkaline developing solutions. In particular, by using the polymeric compounds comprising monomer units of Formula (I) in which n is 1, affinity for developing solutions and rinsing solutions after exposure can markedly be improved.

The resin composition for photoresist and method for fabricating a semiconductor of the present invention use the polymeric compound having such excellent characteristics as a base of photoresist and can thereby form fine patterns with a high degree of precision.

In addition, the present invention also provides novel (meth)acrylic ester derivatives having a lactone skeleton which are useful as, for example, raw materials for the polymeric compounds for photoresist; cyclic alcohols having a lactone skeleton which are useful in production of the (meth)acrylic ester derivatives; and methods for efficiently producing these compounds.

EXAMPLES

The present invention will be illustrated in further detail with reference to several examples below, which are not intended to limit the scope of the invention. A compound indicated by "methacrylate" subsequent to a compound number (monomer number) means a compound having a methacryloyloxy group, of two compounds corresponding to the compound number described in the description.

Production Example 1

Production of Mixture of Compound [1-1] (methacrylate) and Compound [1-2] (methacrylate)
[Diels-Alder Reaction Process]
According to the following formula, 4-oxatricyclo [5.2.1.0$^{2,6}$]dec-8-en-3-one [Compound (A)] was produced.

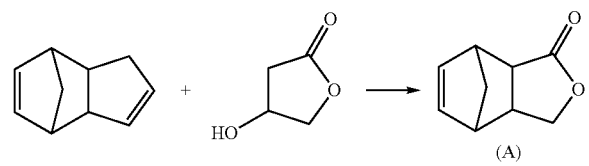

Specifically, 10.4 g (80 mmol) of dicyclopentadiene and 10.2 g (100 mmol) of β-hydroxy-γ-butyrolactone were placed in a pressure vessel equipped with a stirrer, were raised in temperature to 180° C. and were stirred for 2 hours. The reaction mixture was cooled to room temperature, was subjected to silica gel column chromatography and thereby yielded 9.2 g (61 mmol) of Compound (A) in a yield on the basis of β-hydroxy-γ-butyrolactone of 61%.

[Spectral Data of Compound (A)]
GC-MS m/e: 150, 91, 66
$^1$H-NMR (CDCl$_3$, TMS) 500 MHz δ: 6.3 (dd, 1H), 6.29 (dd, 1H), 4.35 (dd, 1H), 3.80 (dd, 1H), 3.33 (m, 1H), 3.27 (dd, 1H), 3.10 (m, 2H), 1.62 (dd, 1H), 1.48 (d, 1H)

[Epoxidation Process]
According to the following formula, 8,9-epoxy-4-oxatricyclo[5.2.1.0$^{2,6}$]decan-3-one [Compound (B)] was produced.

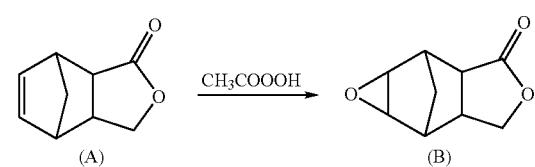

In a flask equipped with a stirrer and a dropping funnel was placed 1.5 g (10 mmol) of 4-oxatricyclo[5.2.1.0$^{2,6}$]dec-8-en-3-one [Compound (A)] and was dissolved in 100 ml of ethyl acetate. To the stirred solution was added dropwise 2.5 g (0.76 g in terms of peroxyacetic acid, 10 mmol) of 30% by weight solution of peroxyacetic acid in ethyl acetate over 10 minutes while controlling the temperature at 45° C. After the completion of addition, the mixture was stirred at 45° C. for further 5 hours. The reaction mixture was then treated in a rotatory evaporator to thereby distill off ethyl acetate. The concentrate was purified on silica gel column chromatography and thereby yielded 1.55 g (9.3 mmol) of Compound (B) in a yield of 93%.

[Spectral Data of Compound (B)]
GC-MS m/e: 165, 138, 109, 91, 81
$^1$H-NMR (CDCl$_3$, TMS) 500 MHz δ: 4.36 (dd, 1H), 4.31 (dd, 1H), 3.34 (m, 2H), 3.11 (dd, 1H), 3.05–2.93 (m, 2H), 2.72 (m, 1H), 1.57 (ddd, 1H), 0.96 (d, 1H)

[Hydrogenation Process]
According to the following formula, a mixture [Mixture (C)] of 8-hydroxy-4-oxatricyclo[5.2.1.0$^{2,6}$]decan-5-one [i.e., 9-hydroxy-4-oxatricyclo[5.2.1.0$^{2,6}$]decan-3-one] and 9-hydroxy-4-oxatricyclo[5.2.1.0$^{2,6}$]decan-5-one [i.e., 8-hydroxy-4-oxatricyclo[5.2.1.0$^{2,6}$]decan-3-one] was produced.

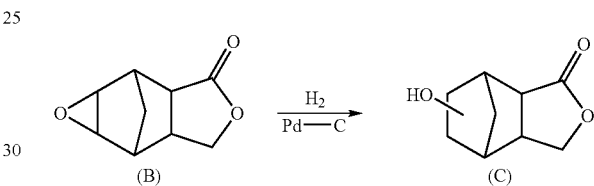

Initially, 6.6 g (40 mmol) of 8,9-epoxy-4-oxatricyclo [5.2.1.0$^{2,6}$]decan-3-one [Compound (B)] was placed in a flask equipped with a stirrer and a hydrogen gas supplier and was then dissolved in 60 ml of methanol. The resulting solution was treated with 0.6 g of 10% by weight Pd—C (a catalyst comprising metal palladium carried on active carbon), a hydrogenation catalyst, at room temperature in an atmosphere of hydrogen gas with stirring until the time came when hydrogen absorption stopped. The reaction time was about 3 hours. The reaction mixture was filtrated, was concentrated, the concentrate was subjected to silica gel column chromatography and thereby yielded 5.4 g (32 mmol) of the title mixture [Mixture (C)] in a yield of 80%.

[Spectral Data of Mixture (C)]
GC-MS m/e: 168, 148, 107, 79

[Esterification Process]
According to the following formula, a mixture [Mixture (D)] of 8-methacryloyloxy-4-oxatricyclo[5.2.1.0$^{2,6}$]decan-5-one [i.e., 9-methacryloyloxy-4-oxatricyclo[5.2.1.0$^{2,6}$]decan-3-one] and 9-methacryloyloxy-4-oxatricyclo[5.2.1.0$^{2,6}$]decan-5-one [i.e., 8-methacryloyloxy-4-oxatricyclo [5.2.1.0$^{2,6}$]decan-3-one] was produced.

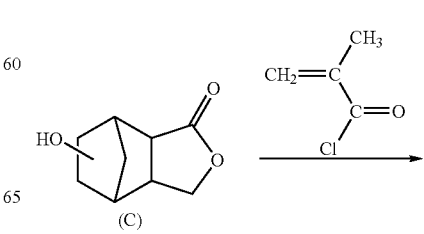

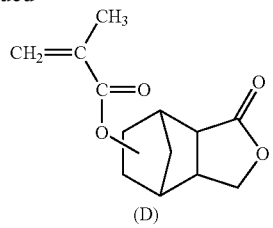

(D)

Initially, 5.0 g (30 mmol) of the mixture [Mixture (C)] of 8-hydroxy-4-oxatricyclo[5.2.1.0$^{2,6}$]decan-5-one and 9-hydroxy-4-oxatricyclo[5.2.1.0$^{2,6}$]decan-5-one and 4.6 g (45 mmol) of triethylamine were placed in a flask equipped with a stirrer and a dropping funnel and were dissolved in 50 ml of dichloroethane as a solvent. To the solution was added dropwise 5.3 g (50 mmol) of methacryloyl chloride while controlling the temperature at 0° C. After the completion of addition, the mixture was stirred at the same temperature for 5 hours. The reaction mixture was washed with an aqueous sodium hydrogencarbonate solution and an aqueous sodium chloride solution successively, was concentrated in a rotatory evaporator, the concentrate was subjected to silica gel column chromatography and thereby yielded 5.3 g (22 mmol) of the title mixture [Mixture (D)] in a yield of 73%. In this connection, Compound [1-1] (methacrylate) and Compound [1-2] (methacrylate) can be separated from each other by crystallization, recrystallization or column chromatography.

[Spectral Data of Mixture (D)]

MS m/e: 236 (M+1), 167, 69

$^1$H-NMR (DMSO-d$_6$, TMS) δ: 6.1 (d, 1H), 5.6 (d, 1H), 4.4–4.2 (m, 2H), 4.0–3.7 (m, 1H), 3.2–3.1 (m, 1H), 3.1–2.1 (m, 6H), 2.1 (m, 1H), 1.9 (s, 3H), 1.3 (m, 1H)

Production Example 2

Production of Mixture of Compound [1-3] (methacrylate) and Compound [1-4] (methacrylate)

[Oxidation Process]

According to the following formula, 8,9-dihydroxy-4-oxatricyclo[5.2.1.0$^{2,6}$]decan-5-one [i.e., 8,9-dihydroxy-4-oxatricyclo[5.2.1.0$^{2,6}$]decan-3-one] [Compound (E)] was produced.

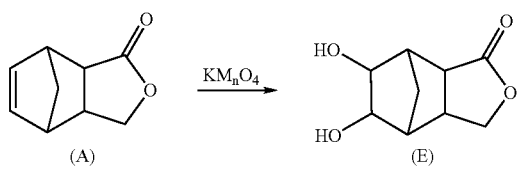

Initially, 21.7 g (120 mmol) of 4-oxatricyclo[5.2.1.0$^{2,6}$]dec-8-en-3-one [Compound (A)] was placed in a 1-L reactor equipped with a stirrer, a thermometer, a cooling tube, and a dropping funnel, was dissolved in 318 g of ethanol and was cooled to −40° C. in a Dewar bath. Separately, 19.0 g (120 mmol) of potassium permanganate (KMnO$_4$) and 14.4 g (120 mmol) of magnesium sulfate (MgSO$_4$) were dissolved in water heated at 60° C., and the resulting solution was added dropwise into the reactor. After the completion of the addition, the reactor was taken out from the Dewar bath, the mixture was left stand to room temperature and was aged over night. After the completion of the reaction, the reaction mixture was filtrated, the filtrate was concentrated, the concentrate was filtrated again to remove insoluble matters, and the filtrate was extracted with ethyl acetate (n=5, s/f=2/1). The ethyl acetate layer was concentrated, the deposited solid matter was washed with toluene, was filtrated, was dried and thereby yielded the title compound [Compound (E)] in a yield of 41%.

[Spectral Data of Compound (E)]

GC-MS m/e: 184, 166, 138, 107, 79

$^1$H-NMR (DMSO-d$_6$, TMS) 500 MHz δ: 4.85 (m, 1H), 4.56 (m, 1H), 4.21 (m, 2H), 3.72 (dd, 1H), 3.51 (dd, 1H), 2.99 (m, 1H), 2.78 (m, 1H), 2.28 (dd, 1H), 2.07 (dd, 1H), 1.89 (ddd, 1H), 1.25 (dd, 1H)

[Esterification Process]

According to the following formula, a mixture [Mixture (F)] of 8-methacryloyloxy-9-hydroxy-4-oxatricyclo[5.2.1.0$^{2,6}$]decan-5-one [i.e., 9-methacryloyloxy-8-hydroxy-4-oxatricyclo[5.2.1.0$^{2,6}$]decan-3-one] and 9-methacryloyloxy-8-hydroxy-4-oxatricyclo[5.2.1.0$^{2,6}$]decan-5-one [i.e., 8-methacryloyloxy-9-hydroxy-4-oxatricyclo[5.2.1.0$^{2,6}$]decan-3-one] was produced.

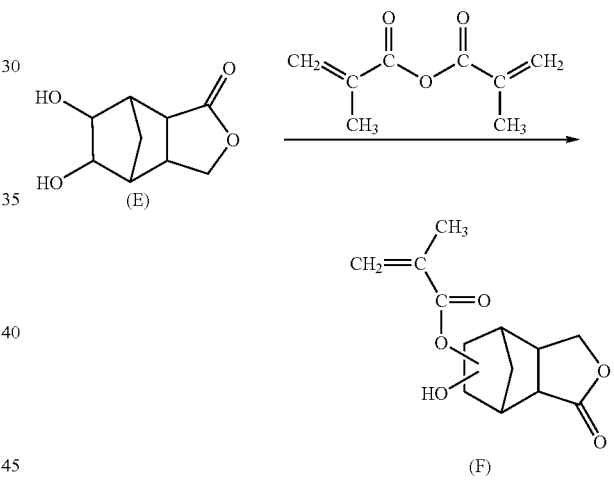

Initially, 6.9 g (37 mmol) of 8,9-dihydroxy-4-oxatricyclo[5.2.1.0$^{2,6}$]decan-5-one [Compound (E)], 11.3 g (111.3 mmol) of triethylamine, 42.8 mg of hydroquinone, and 63 g of tetrahydrofuran were placed in a 200-ml reactor equipped with a stirrer, a thermometer, a cooling tube and a dropping funnel. To the mixture, 6.9 g (44.5 mmol) of methacrylic anhydride was gradually added dropwise at room temperature, followed by aging over night. The reaction mixture was concentrated, the concentrate was subjected to silica gel column chromatography and thereby yielded the title mixture [Mixture (F)] in a yield of 39%. The ratio of Compound [1-3] (methacrylate) to Compound [1-4] (methacrylate) was about 1:5 as determined by gas chromatography.

[Spectral Data of Mixture (F)]

GC-MS m/e: 253, 235, 171, 69

Mixture (F) obtained was dissolved in tetrahydrofuran, followed by recrystallization from methanol, and thereby yielded a white crystal of 9-methacryloyloxy-8-hydroxy-4-oxatricyclo[5.2.1.0$^{2,6}$]decan-5-one [i.e., 8-methacryloyloxy-9-hydroxy-4-oxatricyclo[5.2.1.0$^{2,6}$]decan-3-one] in a yield of 30%.

[Spectral Data of 9-Methacryloyloxy-8-hydroxy-4-oxatricyclo[5.2.1.0$^{2,6}$]decan-5-one]

$^1$H-NMR (DMSO-d$_6$, TMS) 500 MHz δ: 6.05 (s, 1H), 5.65 (s, 1H), 4.26–4.34 (m, 2H), 3.08–3.17 (ddd, 1H), 2.83–2.92 (m, 1H), 2.36 (dd, 1H), 2.33 (dd, 1H), 2.18 (d, 1H), 1.90 (s, 3H), 1.44 (dd, 1H)

Example 1

Production of Polymeric Compound of Following Structure

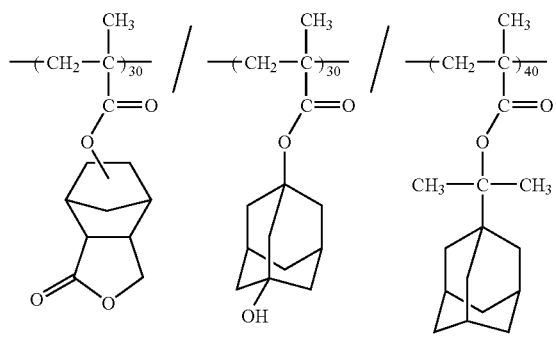

Initially, 2.87 g (12.2 mmol) of a mixture of Monomers [1-1] (methacrylate) and [1-2] (methacrylate), 4.25 g (16.2 mmol) of Monomer [2-1] (methacrylate), 2.87 g (12.2 mmol) of Monomer [3-1] (methacrylate) and 1.00 g of an initiator (available from Wako Pure Chemical Industries, Ltd. under the trade name of V-65) were placed in a 100-ml round-bottom flask equipped with a reflux condenser, a stirring bar and a three-way stopcock and were dissolved in 40 g of tetrahydrofuran. Next, the inside atmosphere of the flask was replaced with dried nitrogen gas, and the mixture was stirred at a constant temperature of the reaction system of 60° C. in an atmosphere of nitrogen gas for 6 hours. The reaction mixture was purified by putting into 500 ml of a mixture of hexane and ethyl acetate (9:1) and filtrating the resulting precipitate. The recovered precipitate was dried under a reduced pressure, was again dissolved in 40 g of tetrahydrofuran, the precipitation and purification procedure was repeated and thereby yielded 6.95 g of the target resin. The recovered polymer was analyzed by gel permeation chromatography (GPC) and was found to have a weight average molecular weight of 6200 and a molecular weight distribution of 2.11. In $^1$H-NMR (in DMSO-d$_6$) analysis, strong signals were observed in the vicinity of 3.1 ppm, 3.7 ppm, 4.2 ppm, and 4.6 ppm, as well as 1.5–2.5 ppm (broad). The polymer has SP of 21.6 (J/cm$^3$)$^{1/2}$.

Example 2

Production of Polymeric Compound of Following Structure

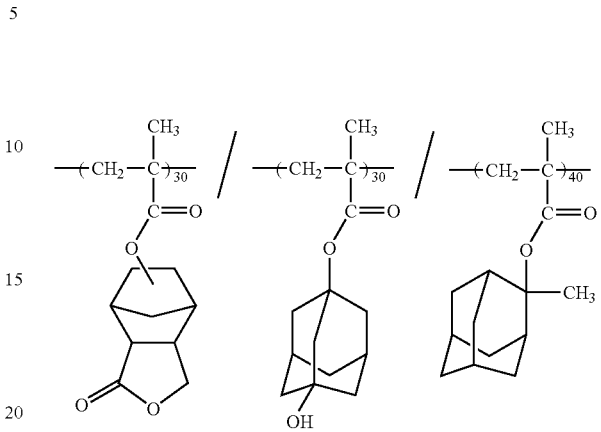

Initially, 3.01 g (12.8 mmol) of Monomer [1-1] (methacrylate), 3.98 g (17.0 mmol) of Monomer [2-19] (methacrylate), 3.01 g (12.8 mmol) of Monomer [3-1] (methacrylate) and 1.00 g of an initiator (available from Wako Pure Chemical Industries, Ltd. under the trade name of V-65) were placed in a 100-ml round-bottom flask equipped with a reflux condenser, a stirring bar and a three-way stopcock and were dissolved in 40 g of tetrahydrofuran. Next, the inside atmosphere of the flask was replaced with dried nitrogen gas, and the mixture was stirred at a constant temperature of the reaction system of 60° C. in an atmosphere of nitrogen gas for 6 hours. The reaction mixture was purified by putting into 500 ml of a mixture of hexane and ethyl acetate (9:1) and filtrating the resulting precipitate. The recovered precipitate was dried under a reduced pressure, was again dissolved in 40 g of tetrahydrofuran, the precipitation and purification procedure was repeated and thereby yielded 6.75 g of the target resin. The recovered polymer was analyzed by GPC and was found to have a weight average molecular weight of 5500 and a molecular weight distribution of 1.98. In $^1$H-NMR (in DMSO-d$_6$) analysis, strong signals were observed in the vicinity of 3.1 ppm, 3.7 ppm, 4.2 ppm, and 4.6 ppm. The polymer has SP of 21.7 (J/cm$^3$)$^{1/2}$.

Example 3

Production of Polymeric Compound of Following Structure

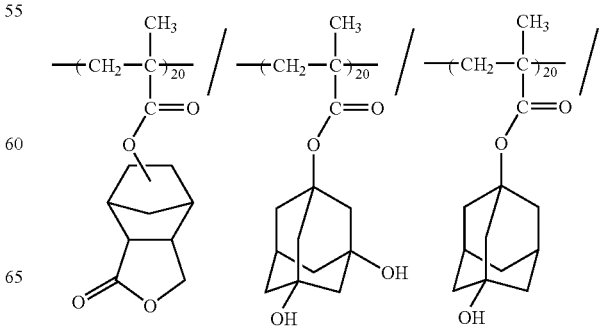

-continued

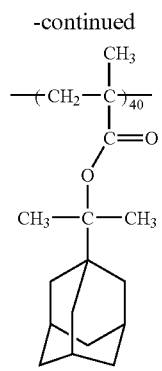

Initially, 1.89 g (8.0 mmol) of a mixture of Monomers [1-1] (methacrylate) and [1-2] (methacrylate), 4.20 g (16.0 mmol) of Monomer [2-1] (methacrylate), 1.89 g (8.0 mmol) of Monomer [3-1] (methacrylate), 2.02 g (8.0 mmol) of Monomer [3-2] (methacrylate) and 1.00 g of an initiator (available from Wako Pure Chemical Industries, Ltd. under the trade name of V-65) were placed in a 100-ml round-bottom flask equipped with a reflux condenser, a stirring bar and a three-way stopcock and were dissolved in 40 g of tetrahydrofuran. Next, the inside atmosphere of the flask was replaced with dried nitrogen gas, and the mixture was stirred at a constant temperature of the reaction system of 60° C. in an atmosphere of nitrogen gas for 6 hours. The reaction mixture was purified by putting into 500 ml of a mixture of hexane and ethyl acetate (9:1) and filtrating the resulting precipitate. The recovered precipitate was dried under a reduced pressure, was again dissolved in 40 g of tetrahydrofuran, the precipitation and purification procedure was repeated and thereby yielded 6.82 g of the target resin. The recovered polymer was analyzed by GPC and was found to have a weight average molecular weight of 6500 and a molecular weight distribution of 2.11. In $^1$H-NMR (in DMSO-$d_6$) analysis, strong signals were observed in the vicinity of 3.1 ppm, 3.7 ppm, 4.2 ppm, and 4.6 ppm, as well as a signal at 1.5–2.5 ppm (broad). The polymer has SP of 21.8 $(J/cm^3)^{1/2}$.

Example 4

Production of Polymeric Compound of Following Structure

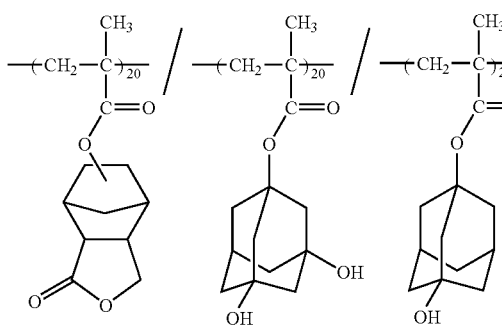

-continued

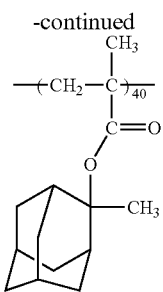

Initially, 1.98 g (8.4 mmol) of Monomer [1-1] (methacrylate), 3.93 g (16.8 mmol) of Monomer [2-19] (methacrylate), 1.98 g (8.4 mmol) of Monomer [3-1] (methacrylate), 2.11 g (8.4 mmol) of Monomer [3-2] (methacrylate) and 1.00 g of an initiator (available from Wako Pure Chemical Industries, Ltd. under the trade name of V-65) were placed in a 100-ml round-bottom flask equipped with a reflux condenser, a stirring bar and a three-way stopcock and were dissolved in 40 g of tetrahydrofuran. Next, the inside atmosphere of the flask was replaced with dried nitrogen gas, and the mixture was stirred at a constant temperature of the reaction system of 60° C. in an atmosphere of nitrogen gas for 6 hours. The reaction mixture was purified by putting into 500 ml of a mixture of hexane and ethyl acetate (9:1) and filtrating the resulting precipitate. The recovered precipitate was dried under a reduced pressure, was again dissolved in 40 g of tetrahydrofuran, the precipitation and purification procedure was repeated and thereby yielded 7.01 g of the target resin. The recovered polymer was analyzed by GPC and was found to have a weight average molecular weight of 5200 and a molecular weight distribution of 1.88. In $^1$H-NMR (in DMSO-$d_6$) analysis, strong signals were observed in the vicinity of 3.1 ppm, 3.7 ppm, 4.2 ppm, and 4.6 ppm. The polymer has SP of 21.9 $(J/cm^3)^{1/2}$.

Example 5

Production of Polymeric Compound of Following Structure

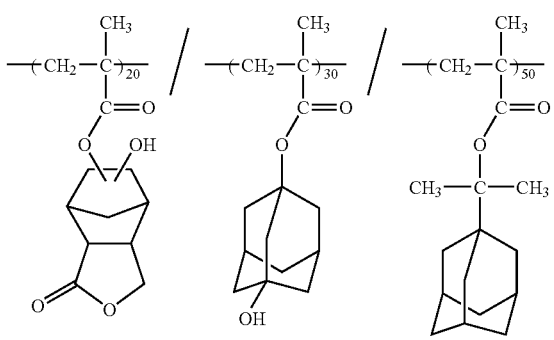

Initially, 2.00 g (7.9 mmol) of a mixture of Monomers [1-3] (methacrylate) and [1-4] (methacrylate), 2.81 g (11.9 mmol) of Monomer [3-1] (methacrylate), 5.19 g (19.8 mmol) of Monomer [2-1] (methacrylate), and 1.00 g of an initiator (available from Wako Pure Chemical Industries, Ltd. under the trade name of V-65) were placed in a 100-ml round-bottom flask equipped with a reflux condenser, a stirring bar and a three-way stopcock and were dissolved in 40 g of tetrahydrofuran. Next, the inside atmosphere of the flask was replaced with dried nitrogen gas, and the mixture was stirred at a constant temperature of the reaction system of 60° C. in an atmosphere of nitrogen gas for 6 hours. The reaction mixture was purified by putting into 500 ml of a mixture of hexane and ethyl acetate (9:1) and filtrating the resulting precipitate. The recovered precipitate was dried under a reduced pressure, was again dissolved in 40 g of tetrahydrofuran, the precipitation and purification procedure was repeated and thereby yielded 7.35 g of the target resin. The recovered polymer was analyzed by GPC and was found to have a weight average molecular weight of 6800 and a molecular weight distribution of 2.11. In $^1$H-NMR (in DMSO-$d_6$) analysis, strong signals were observed in the vicinity of 3.1 ppm, 3.7 ppm, 4.2 ppm, and 4.6 ppm, as well as a signal at 1.5–2.5 ppm (broad). The polymer has SP of 21.4 $(J/cm^3)^{1/2}$.

Example 6

Production of Polymeric Compound of Following Structure

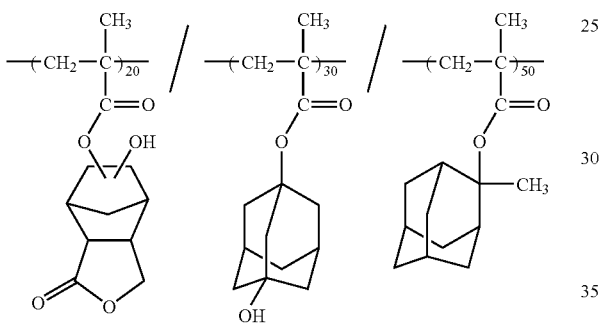

Initially, 2.12 g (8.4 mmol) of a mixture of Monomer [1-3] (methacrylate) and Monomer [1-4] (methacrylate), 2.97 g (12.6 mmol) of Monomer [3-1] (methacrylate), 4.91 g (20.1 mmol) of Monomer [2-19] (methacrylate) and 1.00 g of an initiator (available from Wako Pure Chemical Industries, Ltd. under the trade name of V-65) were placed in a 100-ml round-bottom flask equipped with a reflux condenser, a stirring bar and a three-way stopcock and were dissolved in 40 g of tetrahydrofuran. Next, the inside atmosphere of the flask was replaced with dried nitrogen gas, and the mixture was stirred at a constant temperature of the reaction system of 60° C. in an atmosphere of nitrogen gas for 6 hours. The reaction mixture was purified by putting into 500 ml of a mixture of hexane and ethyl acetate (9:1) and filtrating the resulting precipitate. The recovered precipitate was dried under a reduced pressure, was again dissolved in 40 g of tetrahydrofuran, the precipitation and purification procedure was repeated and thereby yielded 7.13 g of the target resin. The recovered polymer was analyzed by GPC and was found to have a weight average molecular weight of 6700 and a molecular weight distribution of 2.11. In $^1$H-NMR (in DMSO-$d_6$) analysis, strong signals were observed in the vicinity of 3.1 ppm, 3.7 ppm, 4.2 ppm, and 4.6 ppm, as well as a signal at 1.5–2.5 ppm (broad). The polymer has SP of 21.5 $(J/cm^3)^{1/2}$.

What is claimed is:

1. A polymeric compound for photoresist, comprising at least one monomer unit represented by following Formula (I):

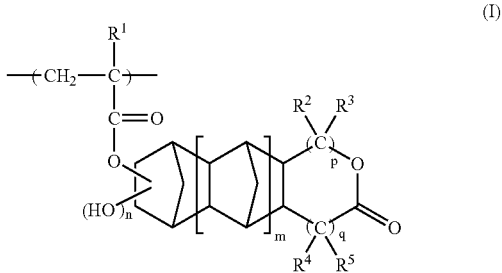

wherein $R^1$, $R^2$, $R^3$, $R^4$ and $R^5$ are the same or different and are each a hydrogen atom or a methyl group; m, p and q each denote an integer of from 0 to 2; and n denotes 1, where the hydroxyl group and the carbonyloxy group extending from a principle chain in the formula are independently combined with either of two carbon atoms on the far-left portion of the rings.

2. The polymeric compound for photoresist according to claim 1, comprising at least one monomer unit represented by Formula (I) and at least one selected from monomer units represented by following Formulae (IIa) through (IIg):

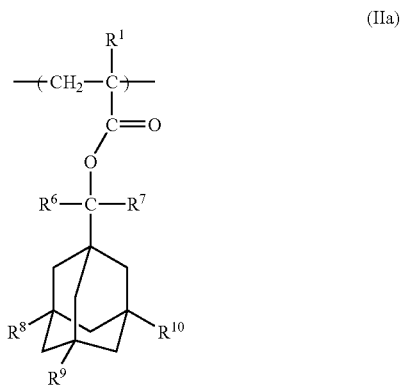

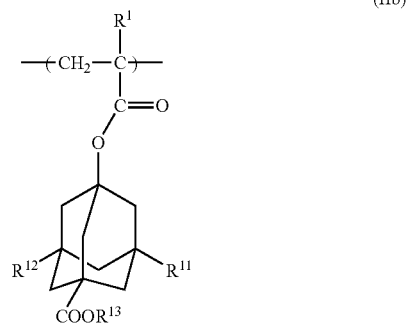

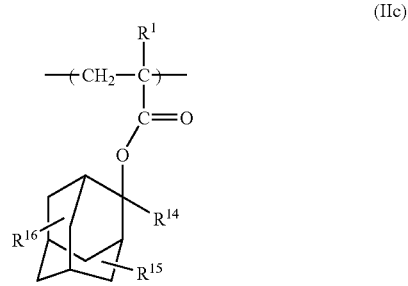

-continued (IId)

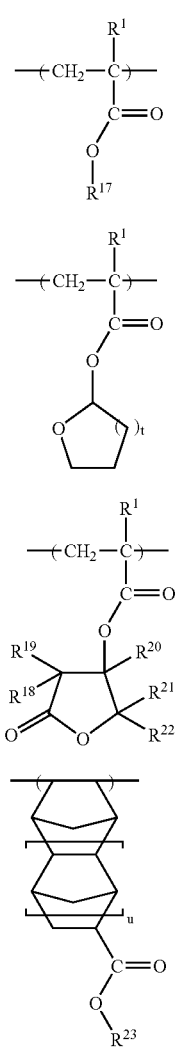

(IIe)

(IIf)

(IIg)

wherein $R^1$ is a hydrogen atom or a methyl group; $R^6$ and $R^7$ are the same or different and are each a hydrocarbon group containing from 1 to 8 carbon atoms; $R^8$, $R^9$ and $R^{10}$ are the same or different and are each a hydrogen atom, a hydroxyl group, or a methyl group; $R^{11}$ and $R^{12}$ are the same or different and are each a hydrogen atom, a hydroxyl group or a —COOR$^{13}$ group, where $R^{13}$ is a t-butyl group, a 2-tetrahydrofuranyl group, a 2-tetrahydropyranyl group or an 2-oxepanyl group; $R^{14}$ is a methyl group or an ethyl group; $R^{15}$ and $R^{16}$ are the same or different and are each a hydrogen atom, a hydroxyl group or an oxo group; $R^{17}$ is a hydrocarbon group having a tertiary carbon atom at the bonding site with the oxygen atom indicated in the formula; $R^{18}$, $R^{19}$, $R^{20}$, $R^{21}$ and $R^{22}$ are the same or different and are each a hydrogen atom or a methyl group; $R^{23}$ is a t-butyl group, a 2-tetrahydrofuranyl group, a 2-tetrahydropyranyl group or an 2-oxepanyl group; t denotes an integer of from 1 to 3; and u denotes 0 or 1.

3. A polymeric compound for photoresist, comprising at least one monomer unit represented by following Formula (I):

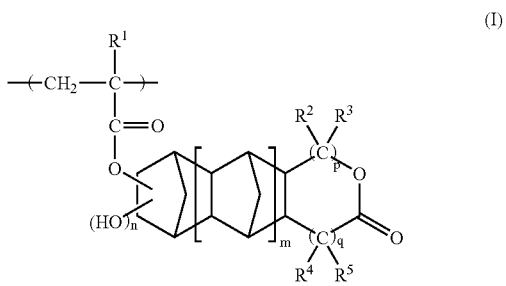

(I)

wherein $R^1$, $R^2$, $R^3$, $R^4$ and $R^5$ are the same or different and are each a hydrogen atom or a methyl group; n, m and q each denote 0; and p denotes 1, where the hydroxyl group and the carbonyloxy group extending from a principle chain in the formula are independently combined with either of two carbon atoms on the far-left portion of the rings.

4. The polymeric compound for photoresist according to claim 1 or 2, further comprising at least one selected from monomer units represented by following Formulae (IIIa) through (IIIh):

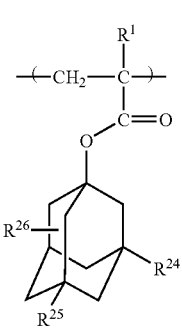

(IIIa)

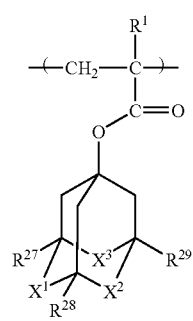

(IIIb)

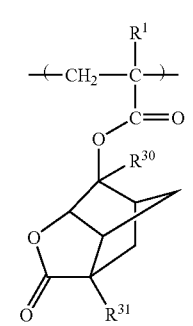

(IIIc)

-continued (IIId)
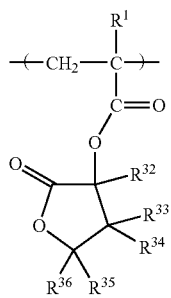

(IIIe)
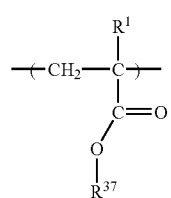

(IIIf)
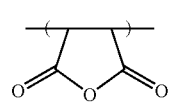

(IIIg)
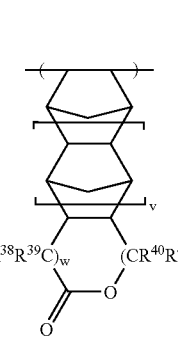

(IIIh)
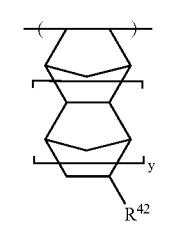

wherein $R^1$ is a hydrogen atom or a methyl group; $R^{24}$ and $R^{25}$ are the same or different and are each a hydrogen atom, a hydroxyl group or a carboxyl group; $R^{26}$ is a hydroxyl group, an oxo group or a carboxyl group; $X^1$, $X^2$ and $X^3$ are the same or different and are each —CH$_2$- or —CO—O—; $R^{27}$, $R^{28}$ and $R^{29}$ are the same or different and are each a hydrogen atom or a methyl group; $R^{30}$ and $R^{31}$ are the same or different and are each a hydrogen atom or a methyl group; $R^{32}$, $R^{33}$, $R^{34}$, $R^{35}$ and $R^{36}$ are the same or different and are each a hydrogen atom or a methyl group; $R^{37}$ is a hydrogen atom or a straight chain, branched chain, cyclic or bridged cyclic hydrocarbon group containing 1 to 20 carbon atoms which may have a substituent; $R^{38}$, $R^{39}$, $R^{40}$ and $R^{41}$ are the same or different and are each a hydrogen atom or a methyl group; $R^{42}$ is a hydrogen atom, a hydroxyl group, a hydroxymethyl group or a carboxyl group; and v, w, x and y are each 0 or 1, in addition to the at least one monomer unit represented by Formula (I) or in addition to the at least one monomer unit represented by Formula (I) and the at least one selected from monomer units represented by Formulae (IIa) through (IIg).

5. The polymeric compound for photoresist according to claim 1, having a solubility parameter of from 19.5 to 24.5 $(J/cm^3)^{1/2}$ as determined by Fedors method.

6. A resin composition for photoresist, comprising at least the polymeric compound for photoresist as claimed in claim 1 or 3 and a photosensitive acid generator.

7. A process for fabricating a semiconductor, the process comprising the steps of applying the resin composition for photoresist as claimed in claim 6 to a base or a substrate to form a resist film, exposing, developing and thereby patterning the resist film.

8. The polymeric compound for photoresist according to claim 3, comprising at least one monomer unit represented by Formula (I) and at least one selected from monomer units represented by following Formulae (IIa) through (IIg):

(IIa)
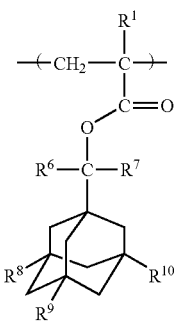

(IIb)
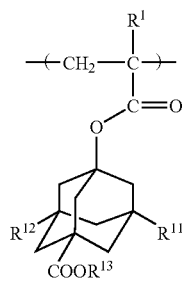

(IIc)
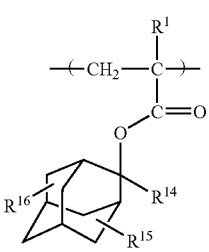

-continued (IId) 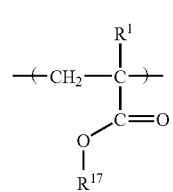

(IIe) 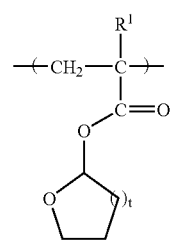

(IIf) 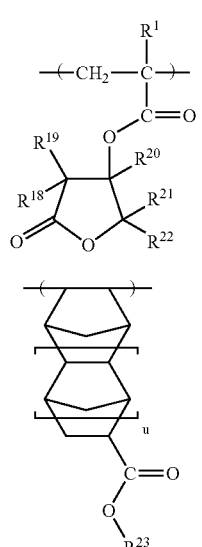

(IIg)

(IIIa) 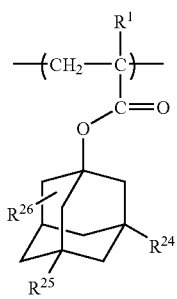

(IIIb) 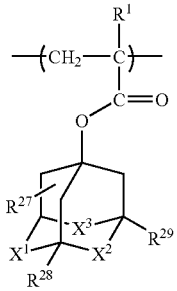

(IIIc) 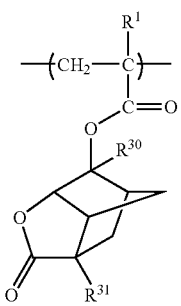

(IIId) 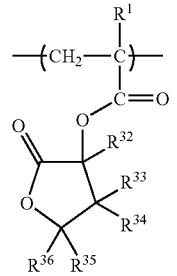

(IIIe) 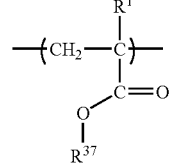

(IIIf) 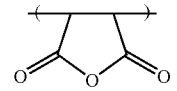

wherein $R^1$ is a hydrogen atom or a methyl group; $R^6$ and $R^7$ are the same or different and are each a hydrocarbon group containing from 1 to 8 carbon atoms; $R^8$, $R^9$ and $R^{10}$ are the same or different and are each a hydrogen atom, a hydroxyl group, or a methyl group; $R^{11}$ and $R^{12}$ are the same or different and are each a hydrogen atom, a hydroxyl group or a —$COOR^{13}$ group, where $R^{13}$ is a t-butyl group, a 2-tetrahydrofuranyl group, a 2-tetrahydropyranyl group or an 2-oxepanyl group; $R^{14}$ is a methyl group or an ethyl group; $R^{15}$ and $R^{16}$ are the same or different and are each a hydrogen atom, a hydroxyl group or an oxo group; $R^{17}$ is a hydrocarbon group having a tertiary carbon atom at the bonding site with the oxygen atom indicated in the formula; $R^{18}$, $R^{19}$, $R^{20}$, $R^{21}$ and $R^{22}$ are the same or different and are each a hydrogen atom or a methyl group; $R^{23}$ is a t-butyl group, a 2-tetrahydrofuranyl group, a 2-tetrahydropyranyl group or an 2-oxepanyl group; t denotes an integer of from 1 to 3; and u denotes 0 or 1.

9. The polymeric compound for photoresist according to claim 3 or 8, further comprising at least one selected from monomer units represented by following Formulae (IIIa) through (IIIh):

-continued

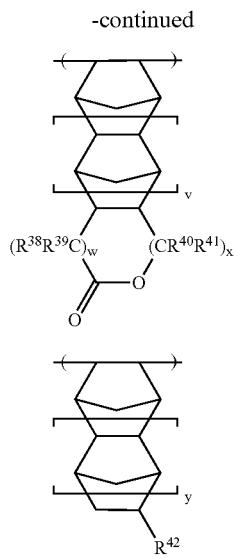

(IIIg)

(IIIh)

wherein $R^1$ is a hydrogen atom or a methyl group; $R^{24}$ and $R^{25}$ are the same or different and are each a hydrogen atom, a hydroxyl group or a carboxyl group; $R^{26}$ is a hydroxyl group, an oxo group or a carboxyl group; $X^1$, $X^2$ and $X^3$ are the same or different and are each —$CH_2$— or —CO—O—; $R^{27}$, $R^{28}$ and $R^{29}$ are the same or different and are each a hydrogen atom or a methyl group; $R^{30}$ and $R^{31}$ are the same or different and are each a hydrogen atom or a methyl group; $R^{32}$, $R^{33}$, $R^{34}$, $R^{35}$ and $R^{36}$ are the same or different and are each a hydrogen atom or a methyl group; $R^{37}$ is a hydrogen atom or a straight chain, branched chain, cyclic or bridged cyclic hydrocarbon group containing 1 to 20 carbon atoms which may have a substituent; $R^{38}$, $R^{39}$, $R^{40}$ and $R^{41}$ are the same or different and are each a hydrogen atom or a methyl group; $R^{42}$ is a hydrogen atom, a hydroxyl group, a hydroxymethyl group or a carboxyl group; and v, w, x and y are each 0 or 1, in addition to the at least one monomer unit represented by Formula (I) or in addition to the at least one monomer unit represented by Formula (I) and the at least one selected from monomer units represented by Formulae (IIa) through (IIg).

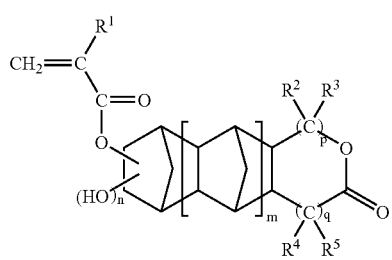

(1)

10. The polymeric compound for photoresist according to claim 3, having a solubility parameter of from 19.5 to 24.5 $(J/cm^3)^{1/2}$ as determined by Fedors method.

11. A (meth)acrylic ester derivative represented by following Formula (1):

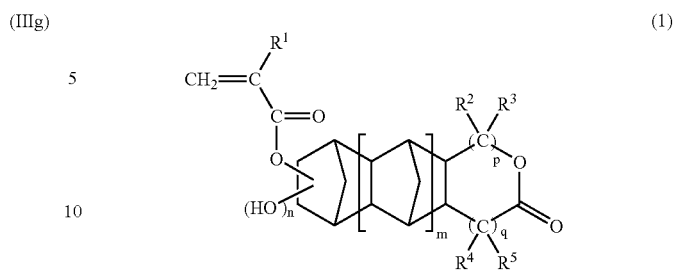

(1)

wherein $R^1$, $R^2$, $R^3$, $R^4$ and $R^5$ are the same or different and are each a hydrogen atom or a methyl group; m, p and q each denote an integer of from 0 to 2; and n denotes 1, where the (meth)acryloyloxy group and hydroxyl group in the formula are independently combined with either of two carbon atoms on the far-left portion of the rings.

12. A process for producing a (meth)acrylic ester derivative, the process comprising the step of allowing a cyclic alcohol represented by following Formula (4):

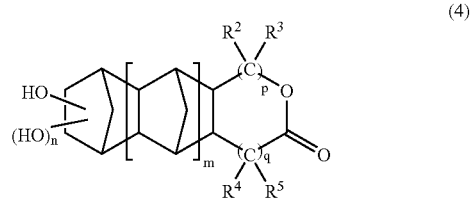

(4)

wherein $R^2$, $R^3$, $R^4$ and $R^5$ are the same or different and are each a hydrogen atom or a methyl group; m, p and q each denote an integer of from 0 to 2; n denotes 0 or 1, where the hydroxyl groups in the formula are independently combined with either of two carbon atoms on the far-left portion of the rings, and where p+q=1 when n is 0, to react with (meth)acrylic acid or a reactive derivative thereof to thereby yield a compound represented by following Formula (1):

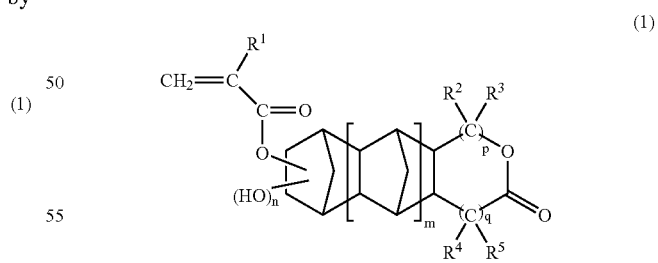

(1)

wherein $R^1$ is a hydrogen atom or a methyl group; and $R^2$, $R^3$, $R^4$, $R^5$, m, p, q, and n have the same meanings as defined above, where the (meth)acryloyloxy group and hydroxyl group in the formula are independently combined with either of two carbon atoms on the far-left portion of the rings.

13. A process for producing a cyclic alcohol, the process comprising the step of reducing an epoxy compound represented by following Formula (5):

(5)

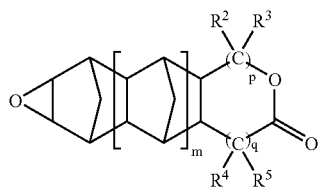

wherein $R^2$, $R^3$, $R^4$ and $R^5$ are the same or different and are each a hydrogen atom or a methyl group; and m, p and q each denote an integer of from 0 to 2,
to thereby yield a cyclic alcohol represented by following Formula (4a):

(4a)

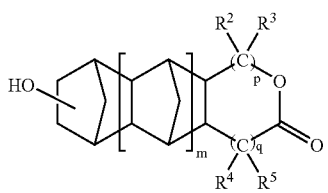

wherein $R^2$, $R^3$, $R^4$, $R^5$, m, p, and q have the same meanings as defined above, where the hydroxyl group in the formula is combined with either of two carbon atoms on the far-left portion of the rings.

14. A cyclic alcohol represented by following Formula (4b):

(4b)

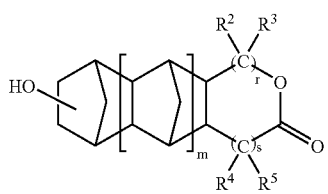

wherein $R^2$, $R^3$, $R^4$ and $R^5$ are the same or different and are each a hydrogen atom or a methyl group; m denotes an integer of from 0 to 2; r and s each denote 0 or 1, where r plus s equals 1, and where the hydroxyl group in the formula is combined with either of two carbon atoms on the far-left portion of the rings.

15. A (meth)acrylic ester derivative represented by following Formula (1):
wherein $R^1$, $R^2$, $R^3$, $R^4$ and $R^5$ are the same or different and are each a hydrogen atom or a methyl group; n, m and q each denote 0; and p denotes 1, where the (meth)acryloyloxy group and hydroxyl group in the formula are independently combined with either of two carbon atoms on the far-left portion of the rings.

* * * * *